US010229889B2

(12) United States Patent
Tatour et al.

(10) Patent No.: US 10,229,889 B2
(45) Date of Patent: Mar. 12, 2019

(54) ON-DIE SEAL RINGS

(71) Applicant: Marvell Israel (M.I.S.L) Ltd., Yokneam (IL)

(72) Inventors: Abed Tatour, Reine Village (IL); Carol Pincu, Rishon LeTsiyon (IL)

(73) Assignee: Marvell Israel (M.I.S.I.) Ltd., Yokneam (IL)

( * ) Notice: Subject to any disclaimer, the term of this patent is extended or adjusted under 35 U.S.C. 154(b) by 0 days.

(21) Appl. No.: 15/802,121

(22) Filed: Nov. 2, 2017

(65) Prior Publication Data
US 2018/0122754 A1 May 3, 2018

Related U.S. Application Data

(60) Provisional application No. 62/416,375, filed on Nov. 2, 2016, provisional application No. 62/460,577, filed on Feb. 17, 2017.

(51) Int. Cl.
*H01L 23/34* (2006.01)
*H01L 21/00* (2006.01)
*H01L 23/58* (2006.01)
*H01L 21/768* (2006.01)
*H01L 23/528* (2006.01)
(Continued)

(52) U.S. Cl.
CPC ........ *H01L 23/585* (2013.01); *G06F 17/5072* (2013.01); *H01L 21/76892* (2013.01); *H01L 21/78* (2013.01); *H01L 23/528* (2013.01); *H01L 23/5226* (2013.01); *H01L 23/562* (2013.01);
(Continued)

(58) Field of Classification Search
CPC . H01L 23/585; H01L 21/76892; H01L 21/78; H01L 23/5226; H01L 23/528; H01L 23/562; G06F 17/5072
See application file for complete search history.

(56) References Cited

U.S. PATENT DOCUMENTS 7,265,436 B2 * 9/2007 Huang ................... H01L 23/562
257/483
8,461,021 B2 * 6/2013 Yaung ................... H01L 23/585
257/620
(Continued)

OTHER PUBLICATIONS

Office Action dated Oct. 17, 2018 in Chinese Patent Application No. 106137982 with English translation, 16 pages.

*Primary Examiner* — Alonzo Chambliss

(57) ABSTRACT

Aspects of the disclosure provide an integrated circuit (IC) formed on a die. The IC includes first one or more electronic circuits and a seal ring structure. The first one or more electronic circuits are disposed on a first semiconductor substrate. The first semiconductor substrate is diced from a semiconductor wafer. The seal ring structure is configured to surround the first one or, more electronic circuits. The seal ring structure is formed by patterning one or more layers of metal compounds on the semiconductor wafer using two or more circuit formation process steps. The seal ring structure includes a remaining portion of a complete seal ring structure after a dicing process step that cuts the complete seal ring structure. The complete seal ring structure has been formed on the semiconductor wafer to surround the first one or more electronic circuits and at least second one or more electronic circuits on a second semiconductor substrate that is diced from the semiconductor wafer.

16 Claims, 13 Drawing Sheets

(51) Int. Cl.
    *H01L 23/522*     (2006.01)
    *H01L 23/00*     (2006.01)
    *G06F 17/50*     (2006.01)
    *H01L 21/78*     (2006.01)
    *H01L 21/321*     (2006.01)

(52) U.S. Cl.
    CPC ...... *H01L 21/3212* (2013.01); *H01L 21/7684* (2013.01)

(56) References Cited

U.S. PATENT DOCUMENTS

| | | | |
|---|---|---|---|
| 8,785,246 B2* | 7/2014 | Vu | H01L 23/544 257/620 |
| 2014/0035106 A1* | 2/2014 | Vu | H01L 21/78 257/620 |
| 2014/0167226 A1* | 6/2014 | Miccoli | G03F 7/70625 257/620 |
| 2014/0327115 A1* | 11/2014 | Vu | H01L 21/78 257/620 |
| 2015/0108613 A1* | 4/2015 | Furusawa | H01L 23/564 257/620 |
| 2015/0249102 A1* | 9/2015 | Terada | H01L 27/1464 257/444 |
| 2015/0287655 A1* | 10/2015 | Killingsworth | H01L 21/768 324/762.02 |
| 2015/0287656 A1* | 10/2015 | Killingsworth | H01L 22/32 324/762.02 |
| 2015/0372045 A1* | 12/2015 | Cheng | H01L 27/14 257/432 |
| 2016/0049348 A1* | 2/2016 | Zhao | H01L 21/568 257/620 |
| 2017/0133271 A1 | 5/2017 | Rotem et al. | |

\* cited by examiner

ON-DIE SEAL RINGS

INCORPORATION BY REFERENCE

This present disclosure claims the benefit of U.S. Provisional Application No. 62/416,375, "TECHNIQUES AND STRUCTURES FOR SELECTABLY PASSING TRACES THROUGH ON-DIE SEAL RINGS" filed on Nov. 2, 2016, and U.S. Provisional Application No. 62/460,577, "TECHNIQUES AND STRUCTURES FOR SELECTABLY PASSING TRACES THROUGH ON-DIE SEAL RINGS" fled on Feb. 17, 2017, which are incorporated herein by reference in their entirety.

BACKGROUND

The background description provided herein is for the purpose of generally presenting the context of the disclosure. Work of the presently named inventors, to the extent the work is described in this background section, as, well as aspects of the description that may not otherwise qualify as prior art at the time of filing, are neither expressly nor impliedly admitted as prior art against the present disclosure.

Seal ring structures are used in semiconductor manufacturing to provide various protections, such as stress protection, moisture protection, for integrated circuits. Typically, the seal ring structures are formed of metal layers and via layers of metal compounds. The seal ring structures on a semiconductor wafer surround dies of integrated circuits to form protected regions between scribe lines (also referred to as dicing lines). In an example, when the semiconductor wafer is diced alone the scribe lines, the seal ring structures protect the integrated circuits in the protected regions from external stress caused by the dicing (sawing) process. The external stress can cause cracking in dies without seal ring protection.

SUMMARY

Aspects of the disclosure provide an integrated circuit (IC) formed on a die. The IC includes first one or more electronic circuits and a seal ring structure. The first one or more electronic circuits are disposed on a first semiconductor substrate. The first semiconductor substrate is diced from a semiconductor wafer. The seal ring structure is configured to surround the first one or more electronic circuits. The seal ring structure is formed by patterning one or more layers of metal compounds on the semiconductor wafer using two or more circuit formation process steps. The seal ring structure includes a remaining portion of a complete seal ring structure after a dicing process step that cuts the complete seal ring structure. The complete seal ring structure has been formed on the semiconductor wafer to surround the first one or more electronic circuits and at least second one or more electronic circuits on a second semiconductor substrate that is diced from the semiconductor wafer.

According to an aspect of the disclosure, the seal ring structure includes a first inner seal ring surrounding the first one or more electronic circuits and a partial outer seal ring surrounding the first inner seal ring. The partial outer seal ring is a remaining portion of a complete outer seal ring after the dicing process step that cuts the complete outer seal ring. The complete outer seal ring has been formed on the semiconductor wafer to surround the first inner seal ring and at least a second inner seal ring that is formed to surround the second one or more electronic circuits on the second semiconductor substrate that is diced from the semiconductor wafer.

In an embodiment, the seal ring structure is formed by patterning at least one of a first metal layer of a first metal compound for forming a metal line connection between circuit elements disposed in the first metal layer of the integrated circuit. In another embodiment, the seal ring structure is formed by patterning at least one of a second metal layer of a second metal compound for forming a via connection between circuit elements disposed in different layers of the integrated circuit.

In an example, the complete outer seal ring is configured to completely surround the first inner seal ring and the second inner seal ring that are adjacent with a scribe line in between, and is diced along the scribe line to leave the partial outer seal ring on the first semiconductor substrate, and another partial outer seal ring on the second semiconductor substrate.

In some examples, the partial outer seal ring is configured to partially surround the first inner seal ring with an opening after the dicing process step. In other examples, the partial outer seal ring is configured to completely surround the first inner seal ring structure after the dicing process step.

In an embodiment, the semiconductor wafer is patterned according to a set of photomasks with at least one substitute photomask for substituting a photomask in the set of photomasks, the substitute photomask defines a first opening in the first inner seal ring and a second opening in the second inner seal ring. In an example, the substitute photomask includes patterns that define interconnections for crossing a scribe line area and interconnecting the first one or more electronic circuits and the second one or more electronic circuits. Further, the substitute photomask omits dummy patterns in the scribe line area.

Aspects of the disclosure provide an integrated circuit (IC) formed on a die. The IC includes first one or more electronic circuits disposed on a semiconductor substrate that is diced from a semiconductor wafer, a first inner ring-like structure surrounding the first one or more electronic circuits, second one or more electronic circuits disposed on the semiconductor substrate, and a second inner ring-like structure surrounding the second one or more electronic circuits. The second inner ring-like structure is, spaced from the first inner ring-like structure by a scribe line area. The IC further includes interconnections configured to cross the scribe line area to interconnect the first one or more electronic circuits with the second one or more electronic circuits and an outer seal ring surrounding the first inner ring-like structure and the second inner ring-like structure.

Aspects of the disclosure provide a method of forming integrated circuit (IC) on a die. The method includes disposing first one or more electronic circuits on a semiconductor wafer, disposing second one or more electronic circuits on the semiconductor wafer, and disposing a first inner seal ring surrounding the first one or more electronic circuits, a second inner seal ring surrounding the second one or more electronic circuits, and an outer seal ring surrounding the first inner seal ring and the second inner seal ring. The second inner seal ring is spaced from the first inner seal ring by a scribe line area. The method further includes dicing from the scribe line area to cut the outer seal ring and separate the semiconductor wafer into at least a first die with the first one or more electronic circuits, the first inner seal ring and a first partial outer seal ring on the first die, and a second die with the second one or more electronic circuits, the second inner seal ring, and a second partial outer seal ring on the second die,

BRIEF DESCRIPTION OF THE DRAWINGS

Various embodiments of this disclosure that are proposed as examples will be described in detail with reference to the following figures, wherein like numeral reference like elements. The figures, are drawn to clearly illustrate the relevant aspects of the various embodiments and are not necessarily drawn to scale.

FIG. 6 shows a plot of a portion of a semiconductor wafer 600 that is diced to form a die that includes multiple modular circuit units after a dicing process according to an embodiment of the disclosure that is similar to the embodiments in FIG. 1 and FIG. 3.

DETAILED DESCRIPTION OF EMBODIMENTS

Aspects of the disclosure provide techniques and seal ring structures to enable producing versatile IC products, by selectively reusing photomasks for different IC product configurations. In an embodiment, multiple modular circuit units are disposed on a semiconductor wafer according to circuit formation process steps. The multiple modular circuit units are spaced out with scribe lines (also referred to as scribe line areas) between the neighboring modular circuit units. The semiconductor wafer can be diced into dies along the scribe lines according to different configurations, in an example, the semiconductor wafer is diced into dies that each includes one modular circuit unit. In another example, the semiconductor wafer is diced into dies that each includes two modular circuit units that are interconnected. In another example, the semiconductor wafer is diced into dies that each includes four modular circuit units that are interconnected. The seal ring structures according to the present disclosure provide protections to the dies in the different configurations.

Figure 1:
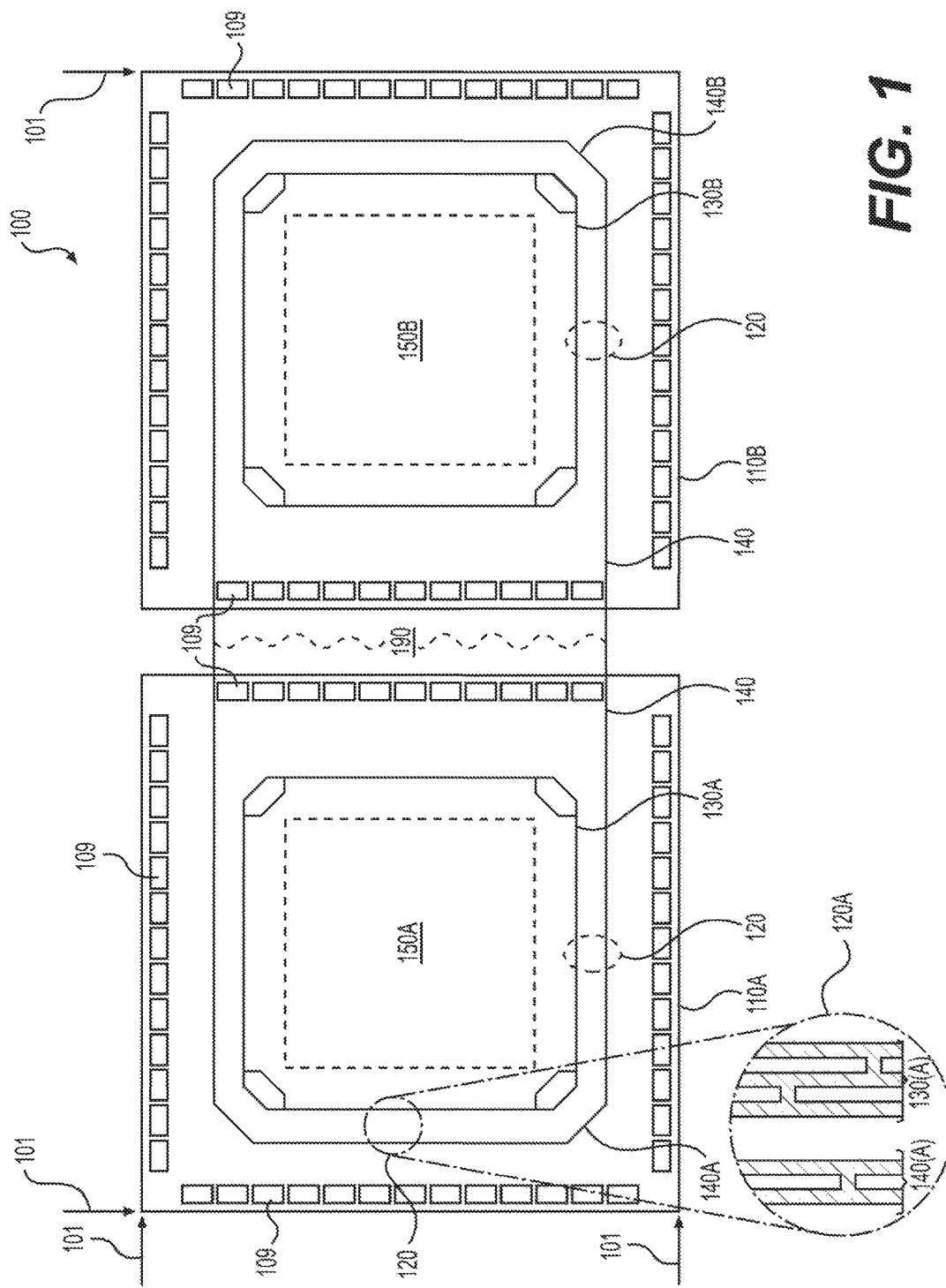
FIG. 1 shows a plot of a portion of a semiconductor wafer 100 that is diced to form two separate dies after a dicing process according to an embodiment of the disclosure.

FIG. 1 shows a plot of a portion of a semiconductor wafer 100 that is diced to form two separate dies 110A and 110B after a dicing process according to an embodiment of the disclosure. In an embodiment, the semiconductor wafer 100 went through circuit formation process steps to form multiple, modular circuit units. In the FIG. 1 example, the portion of the semiconductor wafer 100 includes two modular circuit units 150A and 150B that are spaced apart by a scribe line (scribe line area) 190 in between. The two modular circuit units 150A and 150B are spaced apart relative to other modular circuit units (not shown) with scribe lines 101 in between.

In an embodiment, each of the modular circuit units 150A and 150B includes one or more electronic circuits formed on respective substrate portion of the semiconductor wafer. In an example, the modular circuit units 150A and 150B are of the same circuit design. In another example, the modular circuit units 150A and 150B have different circuit designs.

Further, a seal ring structure 120 is formed by patterning one or more layers of metal compounds on the semiconductor wafer 100. In some embodiments, the seal ring structure 120 is formed concurrently with the metal interconnection layers (e.g. interconnection metal connection layers and interconnection via layers) in the modular circuit units 150A and 150B. The seal ring structure 120 includes a plurality of stacked features formed in respective ones of the plurality of metal interconnection layers. In an example, the modular circuit units 150A and 150B include for example ten metal connection layers (also referred to as metal line layers) and nine via layers. The seal ring structure 120 includes features in the ten metal connection layers and the nine via layers. The features in metal connection layers and the features in the via layers are embedded in respective dielectric layers. In an example, the features in a via layer overlap with the features in the above metal connection layer and also overlap with the features in the below metal connection layer. Thus, the features in the metal connections and the features in the via layers are stacked in direct contact from the first metal connection layer to the tenth metal connection layer. In an embodiment, the features in the various metal interconnection layers are interconnected, and are connected to ground connections in the substrates on the semiconductor wafer.

In an example, a metal connection layer is used to for metal lines that are electrically conductive in the metal connection layer. The metal lines connect circuit elements disposed in the metal connection layer of the integrated circuit. In an example, a via layer is used to form a via connection between circuit elements disposed in for example, a metal connection layer below the via layer and a metal connection layer above the via layer.

In the FIG. 1 example, the seal ring structure 120 is configured to provide complete seal rings respectively for each of the modular circuit units 150A and 150B and provide a complete seal ring, for a combination of the modular circuit units 150A and 150B, Specifically, the seal ring structure 120 includes inner seal rings respectively for each of the modular circuit units 150A and 150B and includes an outer seal ring for the combination of the modular circuit units 150A and 150B. The inner seal rings are positioned at the inner side of the outer seal ring and between the outer seal ring and the respective modular circuits 150A and 150B. For example, the seal rind structure 120 includes a first inner seal ring 130A configured to surround the modular circuit unit 150A, a second inner seal ring 130B configured to surround the modular circuit unit 150B, and includes an outer seal ring 140 configured to surround the combination of the modular circuit units 150A and 150B. The first inner seal ring 130A is positioned at the inner side of the outer seal ring 140 and between the outer seal ring 140 and the modular circuit unit 150A. The second inner seal ring 130B is positioned at the inner side of the outer seal ring 140 and between the outer seal ring 140 and the modular circuit unit 150B.

In the example configuration in which the seal ring structure 120 includes features in the ten metal connection layers and the nine via layers, the first inner seal ring 130A provides 366 coverage surrounding the modular circuit unit 150A in each of the ten metal connection layers and in each of the nine via layers in an example. Similarly, the second inner seal ring 130B provides 360° coverage surrounding the modular circuit unit 150B in each of the ten metal connection layers and in each of the nine via layers; the outer seal ring 140 provides 360° coverage surrounding the combination of the modular circuit units 150A and 150B, and provides vertical coverage in the ten metal connection layers and the nine via layers.

in the FIG. 1 example, during a dicing process, the semiconductor wafer 100 is laser cut or bladed along the scribe lines 101 and along, the scribe line 190 in between the modular circuit units 150A and 150B to separate the semiconductor wafer 100 into dies, such as the first die 110A and the second die 110B. During the dicing process, the first inner seal ring 130A provides stress protection to the modular circuit unit 150A and the second inner seal ring 130B provides stress protection to the modular circuit unit 150B. However, the cut along the scribe line 190 cuts the outer seal ring 140, and leaves a first partial outer seal ring 140A on the first die 110A and leaves a second partial outer seal ring 140B on the second die 110B.

It is noted that in an embodiment, the seal ring structure 120 is not necessarily a uniform thin line, but instead has a patterned structure formed in the metal interconnection layers providing a lateral thickness, an example of which is seen in a close-up view 120A of patterns for features: in a metal interconnection layer of the seal ring structure 120. The close-up view 120A shows patterns 140(A) for features of the outer seal ring 140 and patterns 130(A) for features of the first inner seal ring 130A. It is noted that the patterns in the other metal interconnection layers can be the same as the patterns in the close-up view 120A or can be different from the patterns in the close-up view 120A. It is also noted that the patterns in the close-up view 120(A) are for illustration, different patterns can be suitably used in the seal ring structure 120.

In the FIG. 1 example, dummy patterns 109 are suitably filled at the scribe line area in each of the metal interconnection layers. In an example, the dummy patterns provide a relatively uniform metal density across the semiconductor wafer in a metal interconnection layer, and improve, uniformity by for example Chemical Mechanical Planarization (CMP).

Figure 2:
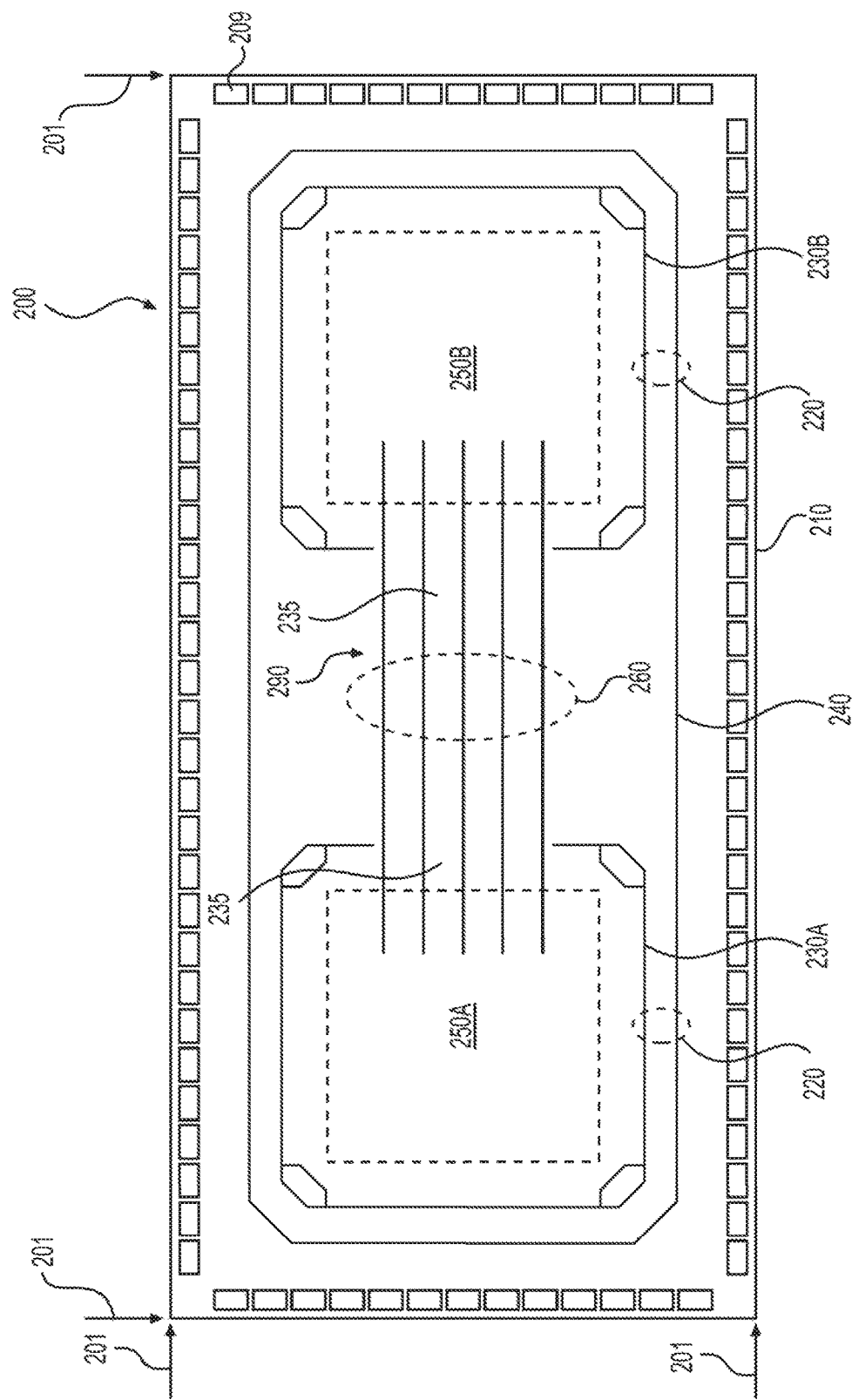
FIG. 2 shows a plot of a portion of a semiconductor wafer 200 that is diced to form a die that includes multiple modular circuit units after a dicing process according to an embodiment of the disclosure.

FIG. 2 shows a plot of a portion of a semiconductor wafer 200 that is diced to form a die that includes multiple modular circuit units after a dicing process according to an embodiment of the disclosure. In an embodiment, the semiconductor wafer 200 went through similar or identical circuit formation process steps as the semiconductor wafer 100 to form multiple modular circuit units. In the FIG. 2 example, the portion of the semiconductor wafer 200 includes two modular circuit units 250A and 250B that are spaced apart by a false scribe line (artificial scribe line) region 290 in between The two modular circuit units 250A and 250B are spaced apart relative to other modular circuit units (not shown) with scribe lines 201 in between.

In an embodiment, each of the modular circuit units 250A and 250B includes one or more electronic circuits formed on a respective substrate portion of the semiconductor wafer 200, in an example, the modular circuit units 250A and 250B are of the same circuit design. In another example, the modular circuit units 250A and 250B have different circuit designs.

Further, a seal ring structure 220 is formed by patterning one or more layers of metal compounds on the semiconductor wafer 200. In some embodiments, the seal ring structure 220 is formed concurrently with the metal interconnection layers (e.g. interconnection metal layer and interconnection via layer) in the modular circuit units 250A and 250B. The seal ring structure 220 includes a plurality of stacked features formed in respective ones of the plurality of metal interconnection layers. In an example, the modular circuit units 250A and 250B include for example ten metal connection layers (also referred to as metal line layers) and nine via layers. The seal ring structure 220 includes features in ten metal connection layers and nine via layers. The features in metal connection layers and the features in the via layers are embedded in respective dielectric layers. The features in a via layer overlap with the features in the above metal connection layer and also overlap with the features in the below metal connection layer. Thus, the features in the metal connections and the features in the via layers are stacked in direct contact vertically from the first metal connection layer to the tenth metal connection layer. In an embodiment, the features in the various metal interconnection layers are interconnected, and are connected to ground connections in the substrates of the semiconductor wafer 200.

in the FIG. 2 example, the seal ring structure 220 is configured to Provide modified inner seal ring (inner ring-like structures) respectively for each of the modular circuit units 250A and 250B and provide a complete outer seal ring for a combination of the modular circuit units 250A and 250B. Specifically, the seal ring structure 220 includes modified inner seal rings respectively for each of the modular circuit units 250A and 250B and includes an outer seal ring for the combination of the modular circuit units 250A and 250B. The modified inner seal rings are positioned at the inner side of the outer seal ring and between the outer seal ring and the respective modular circuit units 250A and 250B. For example, the seal ring structure 220 includes a first modified inner seal ring 230A configured to generally surround the modular circuit unit 250A, a second modified inner seal ring 230B configured to generally surround the modular circuit unit 2508, and includes an outer seal ring 240 configured to completely surround the combination of the modular circuit units 250A and 250B. The first modified inner seal ring 230A is positioned at the inner side of the outer seal ring 240 and between the outer seal ring 240 and the modular circuit unit 250A. The modified second inner seal ring 230B is positioned at the inner side of the outer seal ring 240 and between the outer seal ring 240 and the modular circuit unit 250B.

In the example that the seal ring structure 220 includes features in the ten metal connection layers and the nine via layers, the first modified inner seal ring 230A provides less than 360° seal ring coverage surrounding the modular circuit unit 250A in a first subset of the ten metal connection layers and the nine via layers, and provides full seal ring 360° coverage surrounding the modular circuit unit 250A in a second subset of the ten metal connection layers and the nine via, layers. Similarly, the second modified inner seal ring 2308 provides less than seal ring, 360° coverage, surrounding the modular circuit unit 250B in the first subset of the ten metal connection layers and the nine via layers, and provides 360° full seal ring coverage surrounding the modular circuit unit 250B in the second subset of the ten metal connection layers and the nine via layers. The outer seal ring 240 provides 360° full seal ring coverage surrounding the combination of the modular circuit units 250A and 250B, and provides vertical coverage in the ten metal connection layers and the nine via layers.

Specifically, in an example, the first modified inner seal ring 230A and the second modified inner seal ring 230B includes openings (e.g., openings 235) in, for example the eighth metal connection layer, the ninth metal connection layer, the seventh via layer, the eighth via layer and, the ninth via layer. In an embodiment, traces electrically coupling modular circuit units 250A and 250B are passed through the openings 235, for instance only in those metal connection layers in which the openings are provided. In an example, the first modified inner seal ring 230A and the second modified inner seal ring 230B are complete seal rings without openings in the other metal interconnection layers, such as the first to seventh metal connection layers, the tenth metal connection layer, the first to sixth via layers. The seventh via layer used to form vias to connect metal lines in the seventh metal connection layer and metal lines in the eighth metal connection layer; the eighth via layer is used to form vias to connect metal lines in the eighth metal connection layer and metal lines in the nine metal connection, layer; and the ninth via layer is used to form vias to connect metal lines in the nine metal connection layer and metal lines in the tenth metal connection layer. Further, the eighth metal connection layer, the ninth metal connection layer, the seventh via layer, the eighth via layer and the ninth via layer are used to form interconnections that'pass though the openings and the false scribe line 290 to interconnect circuits in the modular circuit unit 250A with circuits in the modular circuit in it 250B.

In the FIG. 2 example, during a dicing process, the semiconductor wafer 200 is laser cut or bladed along the scribe lines 201 to separate the combined die on which the modular circuit units 250A and 250B are disposed from other modular circuit units (not shown). It is noted that, in this example embodiment, the semiconductor wafer 200 is not cut along the false scribe line 290. During the dicing process, the outer seal ring 240 provides stress protection fey the combination of the modular circuit unit 250A and the modular circuit unit 250B, in an example.

Similar to the example in FIG. 1, the seal ring structure 220 has suitable patterns for the features in each of the metal interconnection layers.

In the FIG. 2 example, dummy patterns 209 are suitably formed in the scribe line area 201 in each of the metal interconnection layers, to provide, for example, structural integrity in the dicing process. However, dummy patterns for the false scribe line area 290 are omitted in the first subset of metal interconnection layers that provide openings in the first inner seal ring 230A and the second inner seal ring 230B. It is noted that, in an example, the second subset of metal interconnection layers also has dummy patterns in the false scribe line area 290. In the FIGS. 3-7, semiconductor wafers 300-700 include components that are identical or equivalent to those in the semiconductor wafer 100 in FIG. 1. Specifically, components 301-701 are identical or equivalent to component 101, components 309-709 are identical or equivalent to component 109, components 310A-710A are identical or equivalent to component 110A, components 320A-720A are identical or equivalent to component 120A, components 330A-730A are identical or equivalent to component 130A, components 340A-740A are identical or equivalent to component 140A, components 310B-710B are identical or equivalent to component 110B, components 320B-720B are identical or equivalent to component 120B, components 330B-730B are identical or equivalent to component 130B, components 340B-740B are identical or equivalent to component 140B, and components 390-790 are identical or equivalent to component 190. In FIG. 4, components 441A and 441B are identical or equivalent to component 341A and 341B of FIG. 3. In FIG. 9, component 917 is identical or equivalent to component 817 of FIG. 8.

Figure 3:
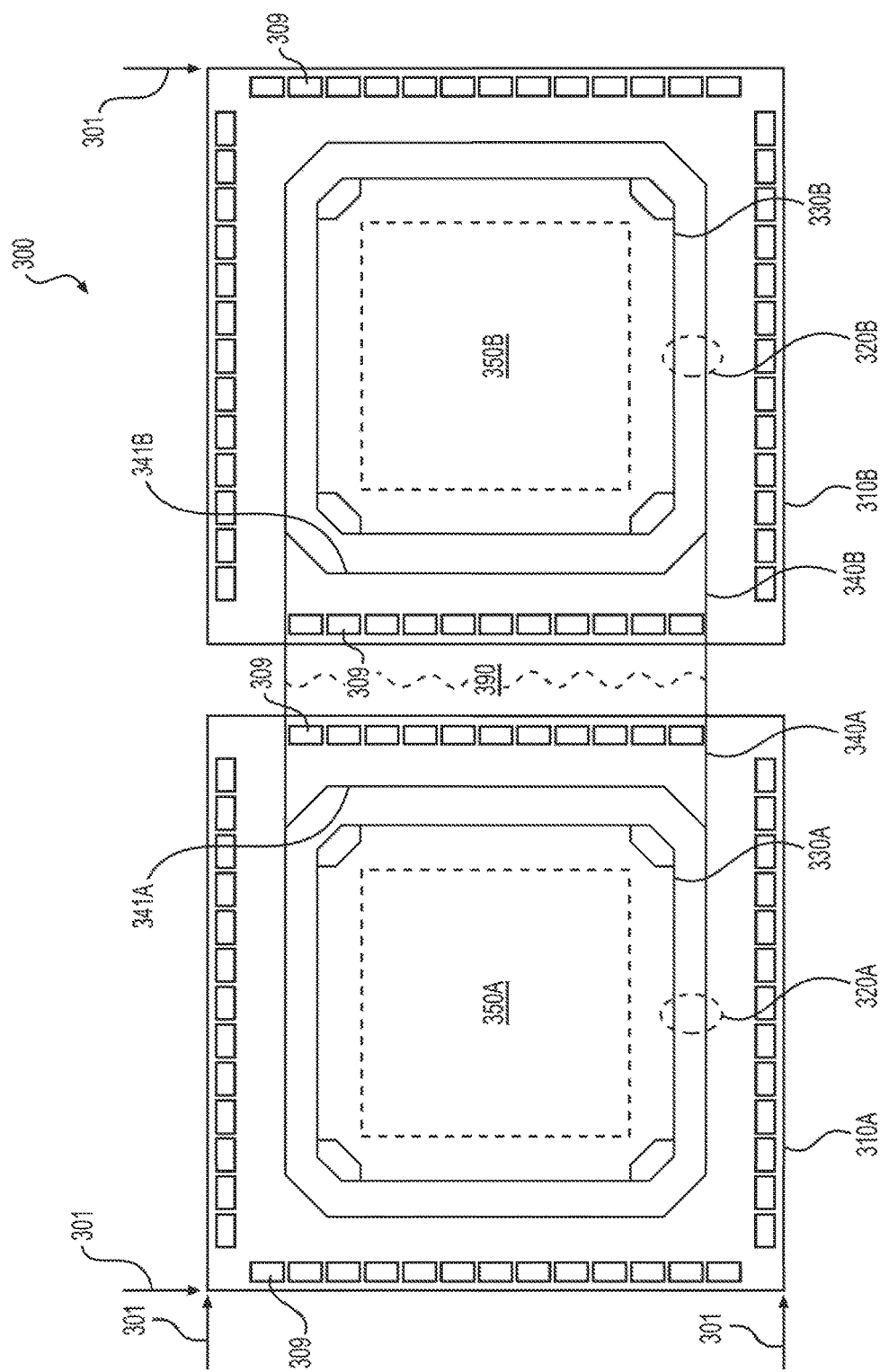
FIG. 3 shows a plot of a portion of a semiconductor wafer 300 that is diced to form two separate dies after a dicing process according to another embodiment of the disclosure that is is similar to the embodiment in FIG. 1.
Figure 4:
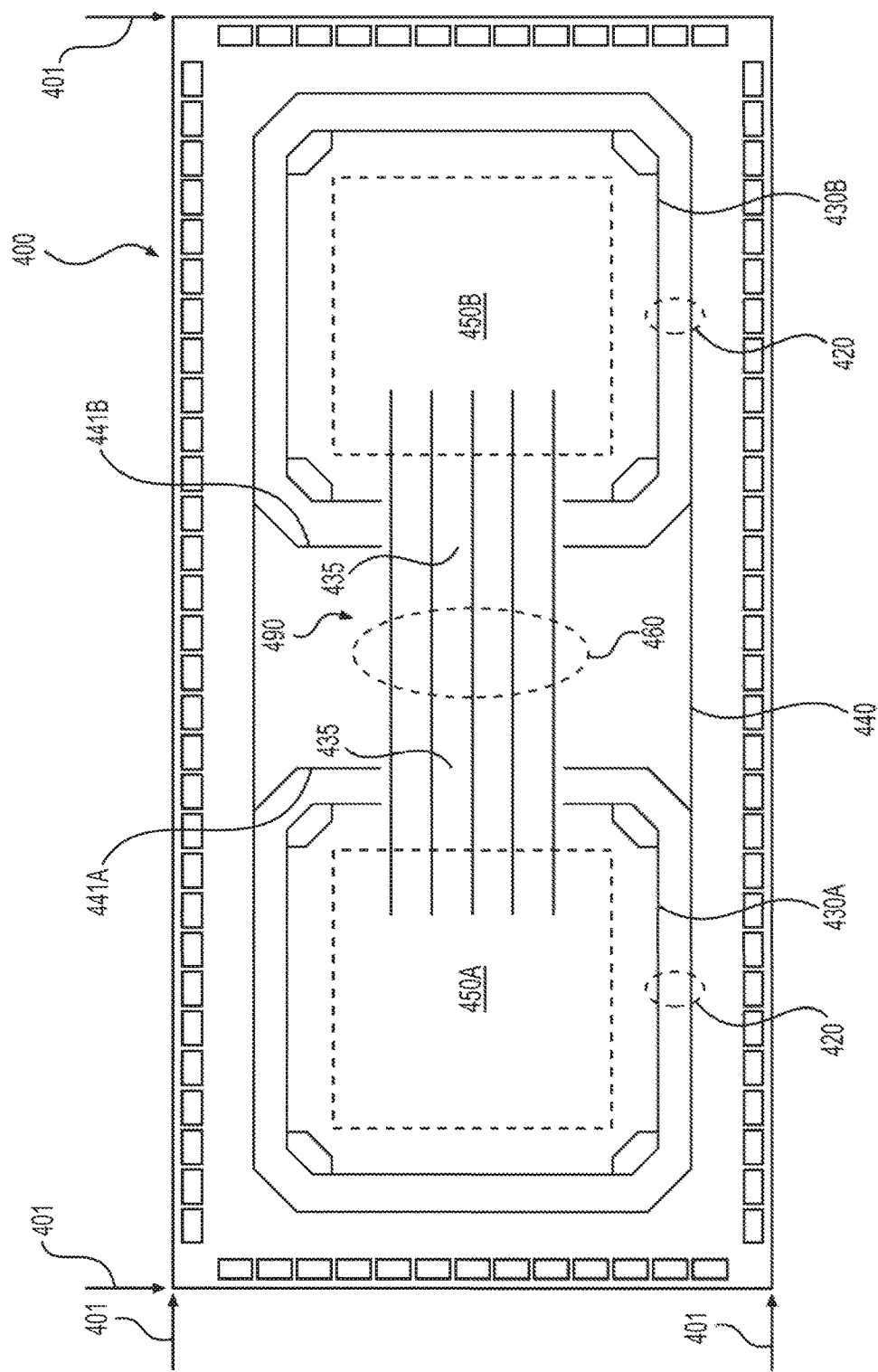
FIG. 4 shows a plot of a portion of a semiconductor wafer 400 that is diced to form a die that includes multiple modular circuit units after a dicing process according to another embodiment of the disclosure that is similar to the embodiment in FIG. 2.

FIG. 3 shows a plot of a portion of a semiconductor wafer 300 that is diced to form two separate dies after a dicing process according to another embodiment of the disclosure. The semiconductor wafer 300 includes components that are identical or equivalent to those in the semiconductor wafer 100 in the FIG. 1 example; the description of these components has been provided above and will be omitted here for clarity purposes.

However, in the FIG. 3 example, the outer seal ring 340 includes additional features 341A and 341B which are absent from the embodiment of FIG. 1, and which provide an outer seal ring respectively for both of the modular circuit units 350A and 350B. Thus, in the example of FIG. 3, the outer seal ring 340 additionally provides 360° coverage surrounding each of the modular circuit units 350A and 350B, and provides vertical coverage in each of the ten metal connection layers and the nine via layers.

FIG. 4 shows a plot of a portion of a semiconductor wafer 400 that is diced to form a die that includes multiple modular circuit units after a dicing process according to another embodiment of the disclosure. The semiconductor wafer 400 includes components that are identical or equivalent to those in the semiconductor wafer 200 in the FIG. 2 example; the description of these components has been provided above and will be omitted here for clarity purposes.

However, in the FIG. 4 example, the outer seal ring 440 includes additional features. In an example, in the second subset of metal interconnection layers, the additional features are similar to the additional features 341A and 341B in the FIG. 3 example; and in the first subset of metal interconnection layers, the additional features include openings, such as shown by 441A and 441B.

Figure 5:
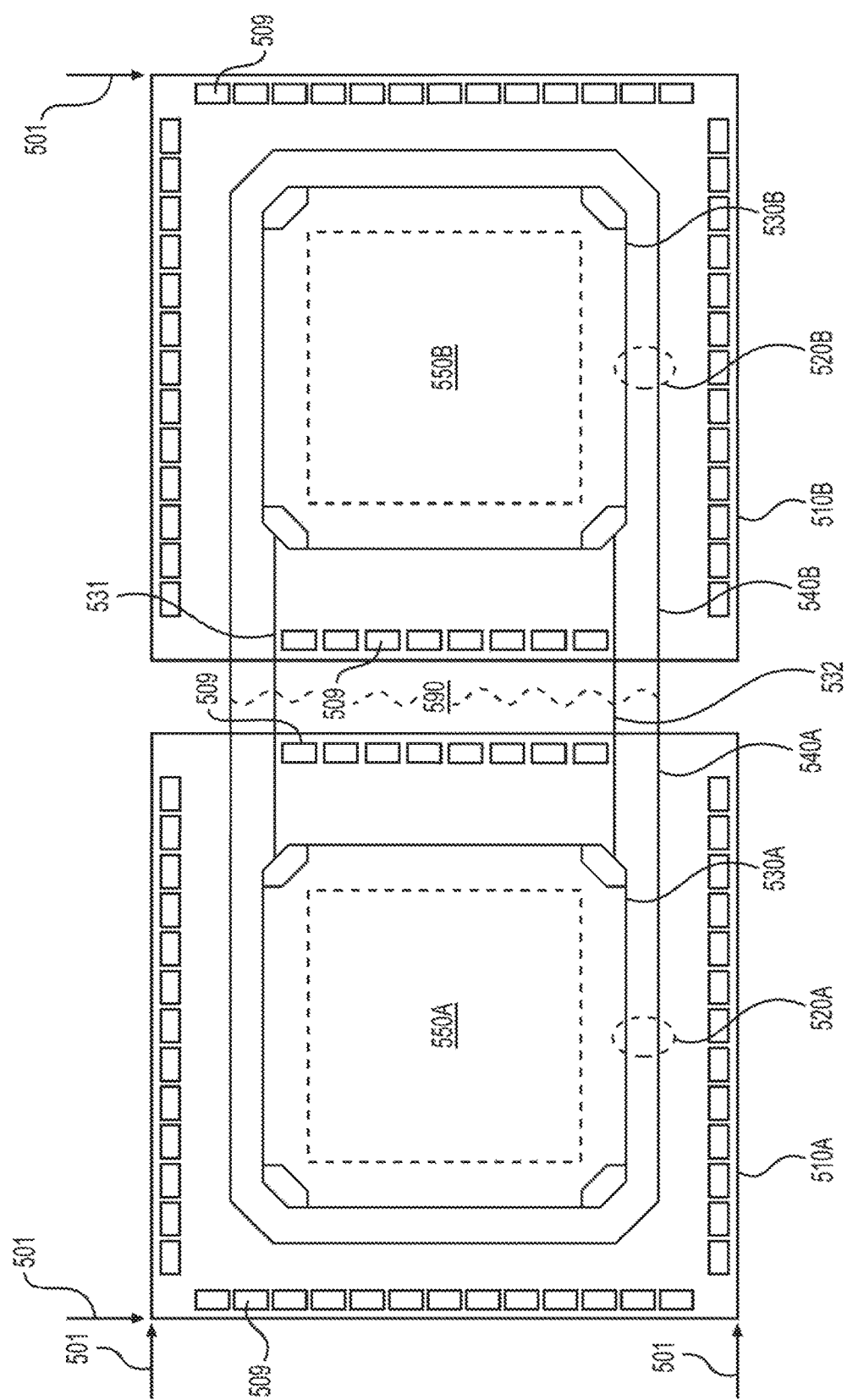

FIG. 5 shows a plot of a portion of a semiconductor wafer 500 that is diced to form two separate dies after a dicing process according to an embodiment of the disclosure The semiconductor wafer 500 includes components that are identical or equivalent to those in die semiconductor wafer 100 in the FIG. 1 example; the description of these components has been provided above and will be omitted here for clarity purposes.

However, in the FIG. 5 example, the seal ring structure 520 includes additional features 531 and 532 that connect the first inner seal ring 530A and the second inner seal ring 530B. In an example, the additional features 531 and 532 are in each of the metal interconnection layers.

Figure 6:
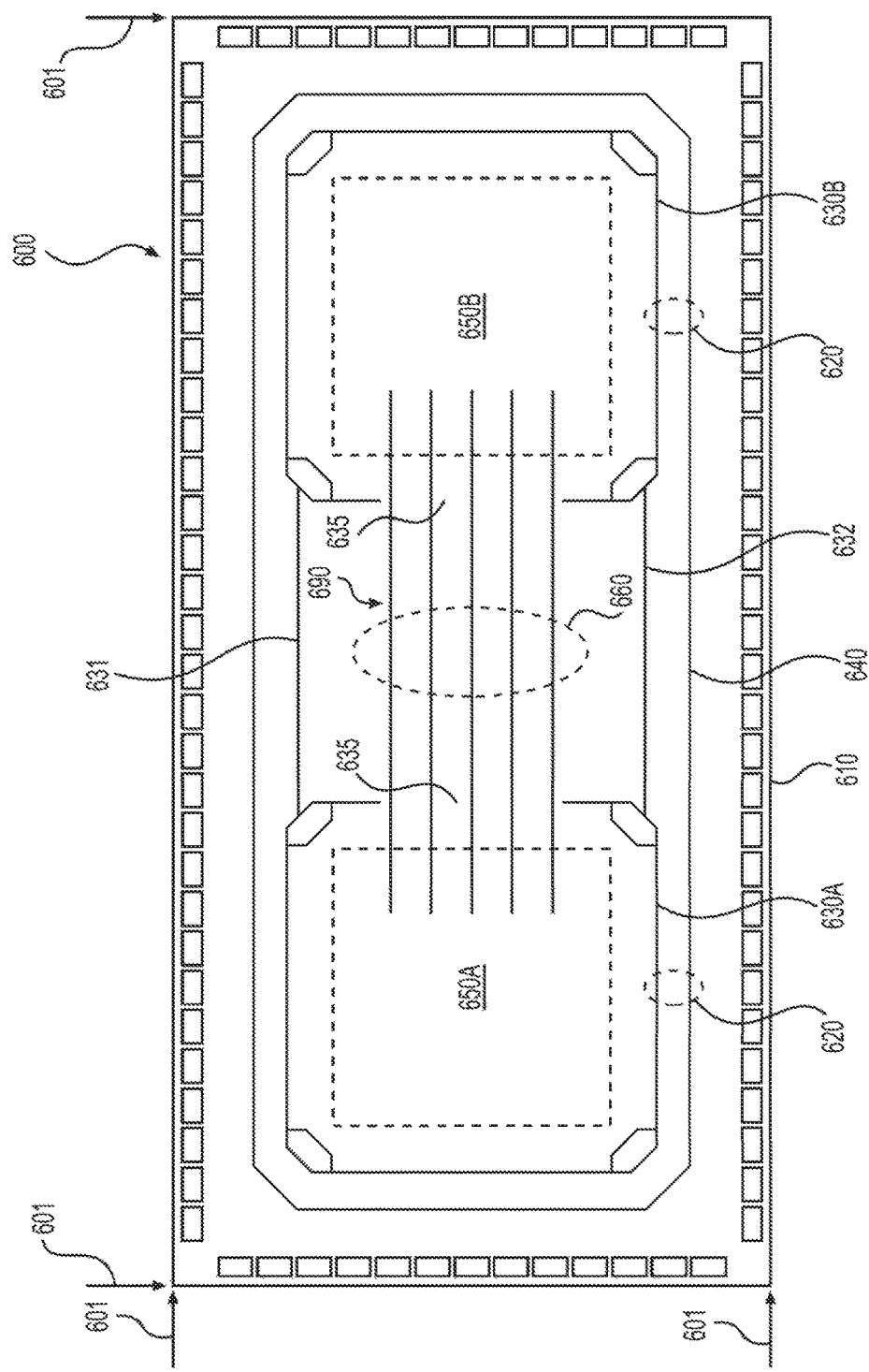
FIG. 6 shows a plot of a portion of a semiconductor wafer 500 that is diced to form two separate dies after a dicing process according to an embodiment of the disclosure that is similar to the embodiments in FIG. 1 and FIG. 3.

FIG. 6 shows a plot of a portion of a semiconductor wafer 600 that is diced to form a die that includes multiple modular circuit units after a dicing process according to an embodiment of the disclosure. The semiconductor wafer 600 it components that are identical or equivalent to those in the semiconductor wafer 200 in the FIG. 2 example; the description of these components has been, provided above and will be omitted here for clarity purposes.

However, in the FIG. 6 example, the seal ring structure 620 includes additional features 631 and 632 that connect the first inner seal ring 630A and the second inner seal ring 630B. In an example, the additional features 631 and 632 are in each of the metal interconnection layers.

Figure 7:
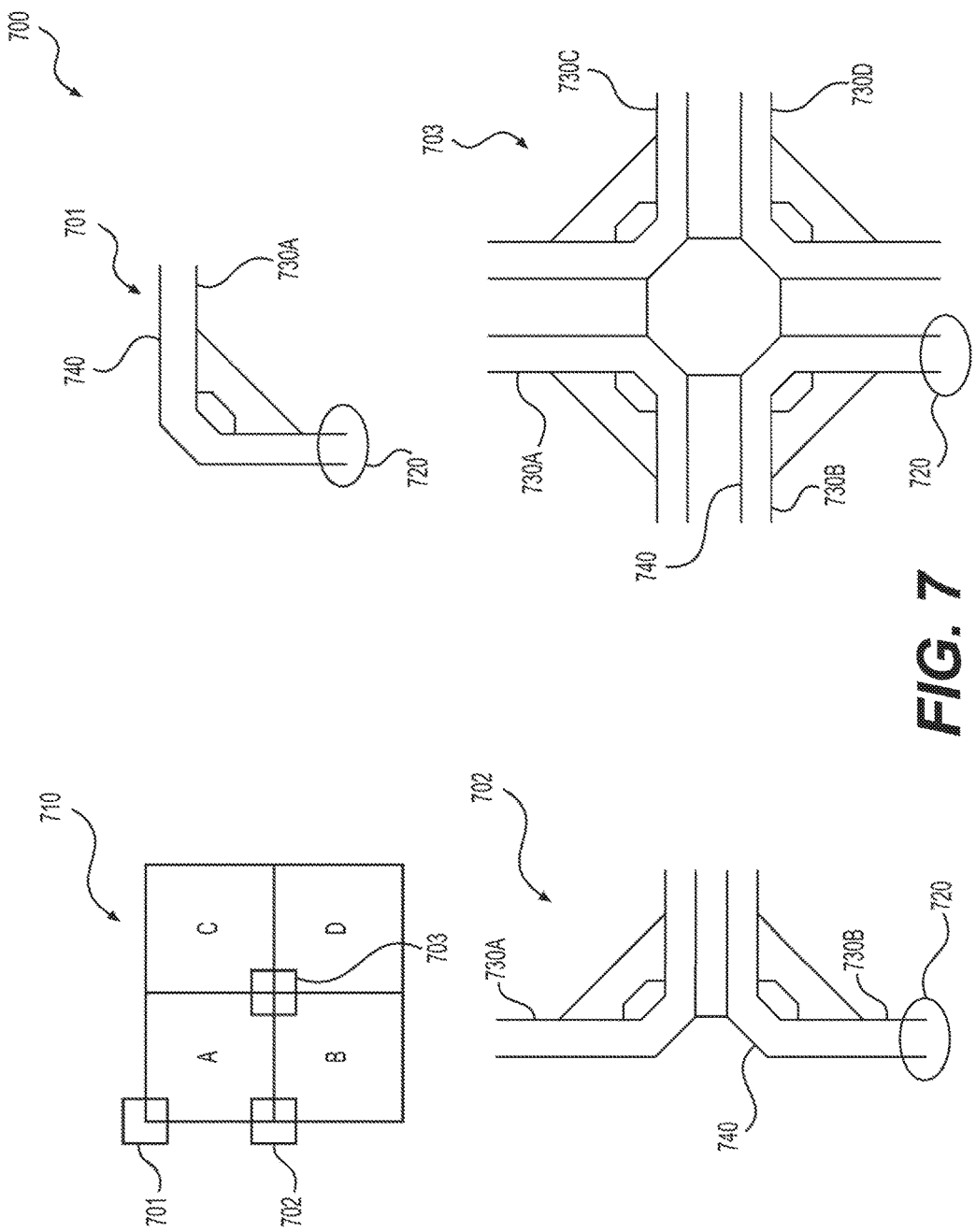
FIG. 7 shows a plot of a portion of a semiconductor wafer 700 according to are embodiment of the disclosure.

FIG. 7 shows a plot of a portion 710 of a semiconductor wafer 700 according to an embodiment of the disclosure. The portion 710 of the semiconductor 700 includes four modular circuit units A-D. FIG. 7 shows patterns for a seal ring structure 720 at various boundary positions 701-703. In the FIG. 7 example, the seal ring structure 720 is configured to provide complete seal rings respectively for each of the modular circuit units A-D and provide a complete seal ring for combinations of the modular circuit units A-D, such as a combination of modular circuit units A and B, a combination of modular circuit units C and D, a combination of modular circuit units A and C, a combination of modular circuit units B and D, and a combination of modular circuit units A-D. Specifically, the seal ring structure 720 includes inner seal rings respectively for each of the modular circuit units A-D, and an outer seal ring for any combination of the modular circuit units A-D. The inner seal rings are positioned at the inner side of the outer seal ring and between the outer seal ring and the respective modular circuits A-D. For example, the seal ring structure 720 includes a first inner seal ring 730A configured to surround the modular circuit unit A, a second inner seal ring 730B configured to surround the modular circuit unit B, a third inner seal ring 730C configured to surround the modular circuit unit C, a fourth inner seal ring 730D configured to surround the modular circuit unit D. Further, the seal ring structure 720 includes an outer seal ring 740 configured to surround the any combination of the modular circuit units A-D.

The semiconductor wafer 700 includes components that are identical or equivalent to those in the semiconductor wafer 100 and the those in the semiconductor 200; the description of these components has been provided above and will be omitted here for clarity purposes.

According to an aspect of the disclosure, the dies 110A and 110B, and the die 210 are manufactured according to a set of photomasks that includes alternative photomasks for upper level photomasks.

Figure 8:
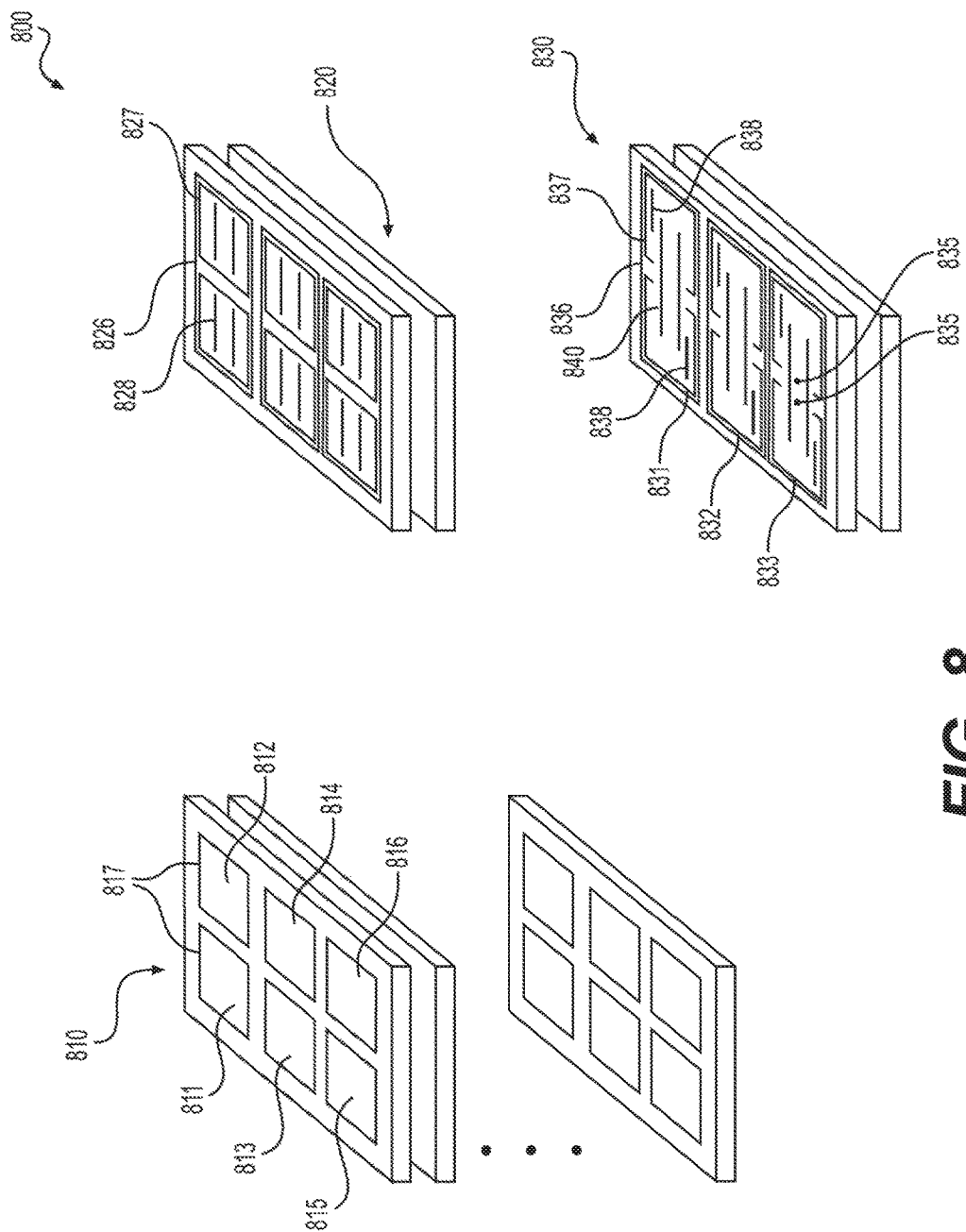
FIG. 8 shows a diagram of a set of photomasks 800 according to an embodiment of the disclosure.
Figure 9:
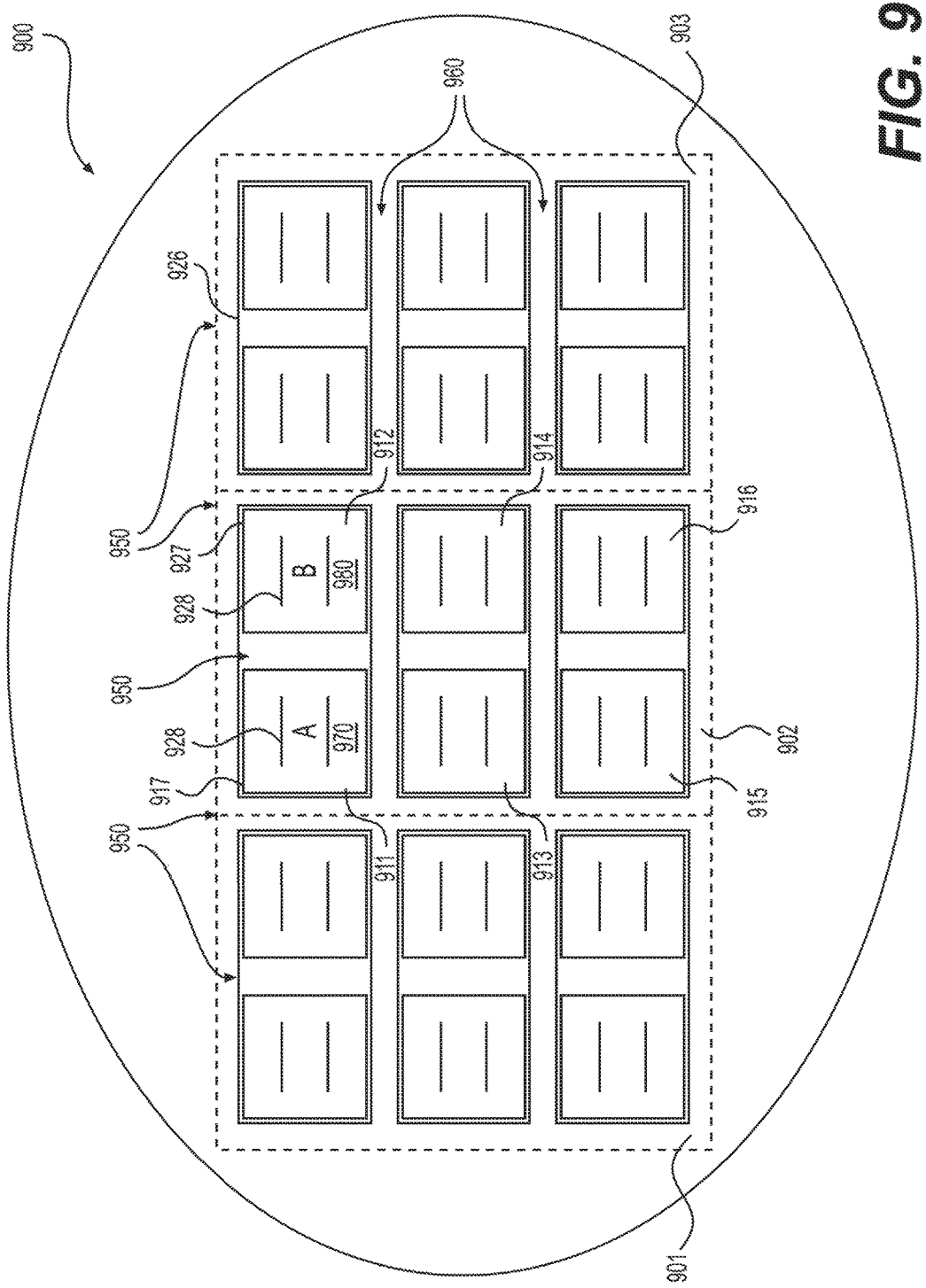
FIG. 9 shows a diagram of a semiconductor wafer 900 manufactured using the photomasks 800 according to an embodiment of the disclosure.

FIG. 8 shows a diagram of a set of photomasks 800 for integrated circuit (IC) products according to an embodiment of the disclosure. The set of photomasks 800 includes a subset of lower level photomasks 810 and multiple subsets of upper level photomasks 820-830. in the FIG. 8 example, the set of photomasks 800 includes a first subset of upper level photomasks 820 and a second subset of upper level photomasks 830. Each of the multiple subsets of upper level photomasks 820-830 is workable with the subset of lower level photomasks 810. For example, the first subset of upper level photomasks 820 and the subset of lower level photomasks 810 are used to manufacture one or more IC products; and the second subset of upper level photomasks 830 and the subset of lower level photomasks 810 are used to manufacture a different IC product from the one or more IC products, such as an IC product that combines two or more units of the one or more IC products.

According to an aspect of the disclosure, the set of photomasks 800 is generated based on circuit layout provided by circuit designers, and is used at a semiconductor manufacturing facility to manufacture variety of IC products.

In an embodiment, at a system design stage, the circuit designers design a composite system that combines two or more component systems. In an example, each of the component systems is an individually operable system that does not rely on the other component systems, and the two or more component systems are combined using communication channels to form the composite system. For example, a component system is a network switch system with a bandwidth of 5 terabits per second (Tbps). A composite system combines multiple network switch systems (e.g., two, four . . . ) to form a larger network switch system with a larger bandwidth (e.g., 10 Tbps, 20 Tbps . . . ). The circuit designers deter nine system-level functional specification and architectures of the composite system, and the component systems. In an example, the circuit designers determine system-level functional specification and architectures of the component systems, and combine the component systems using communication channels to farm the composite system. For example, the circuit designers generate a communication channel between two component systems. In the example, each component system includes interfaces to the communication channel, and sends data signals or control signals to the other component system via the communication channel.

Further in an embodiment, at a register transfer level (RTL) stage, the circuit designers convert the system-level functional specification of the component systems and the composite system into a register transfer level (RTL) description. In an embodiment, the circuit designers convert the system-level functional specification of the component systems into the RTL description. In an example, when the component systems are of the same system-level functional specification, the circuit designers convert the system-level functional specification of a component system into the RTL description. In another example, when the component systems are of different system-level functional specification, the circuit designers convert the system-level functional specification of the respective component systems into the RTE description.

Further, the circuit designers combine the RTL description of the component systems using signal transmission models to form the RTL description of the composite system.

Then, at a physical design stage, the circuit designers create layout for the component systems and the composite system. In an embodiment, the circuit designers create modular layout for the component systems. The modular layout includes patterns in various layers, such as an active layer, a well layer, a polysilicon layer, a source/drain layer, contact layers, a plurality of metal layers, via layers, and the like to form circuit structures in the component systems. In an example, the metal layers are separately referred as lower metal layers and upper metal layers. In a typical semiconductor manufacturing process, the upper metal layers are generated and patterned on a semiconductor substrate later than the lower metal layers. in an example, a semiconductor manufacturing process five metal layers are produced. The first three metal layers in the semiconductor manufacturing process are referred to as lower metal layers, and the last two metal layers in the semiconductor manufacturing process are referred to as upper metal layers. In an example, the semiconductor manufacturing process patterns the semiconductor wafer from bottom up, the upper level metal layers are disposed on top of the lower level metal layers.

In an example, when the component systems are of the same RTL description, the circuit designers create a modular layout for a component system, and suitably adjust the modular layout for other component systems. In another example, when the component systems are of different RTL description, the circuit designers create respective modular layouts for the component systems.

Further, the circuit designers suitably place the modular layouts together to form a layout including the component systems in the composite system. Then, the circuit designers create at least one replacement upper layer, such as a replacement upper metal layer, a replacement via layer, and the like to replace upper layers in order to combine the component systems into the composite system. The replacement upper layers include patterns to form the interconnections that connect the component systems.

In an embodiment, the circuit designers determine constrains for creating the modular layouts of the component systems in order to facilitate combining, the component systems. In an example, the circuit designers limit a dimension of the modular layouts for the component systems to be about the same size, or within a size range. In another example, the circuit designers specify a specific area in a modular layout for circuits interfacing with the interconnections.

It is noted that the circuit designers add other suitable patterns, such as dummy patterns, parametric test structures, alignment marks, and the like in the layout for various other purposes.

It is noted that the circuit designers perform other suitable design steps, such as simulation, optimization, design for testing, design for manufacturing and the like. When the layout that includes the replacement upper layers is finalized, the circuit designers create a data file for the layout. Based on the data file, a set of photomasks, such as the set of photomask 100 is created, and used in semiconductor wafer manufacturing.

According to an aspect of the disclosure, the set of photomasks 800 is suitably used at a semiconductor manufacturing facility for manufacturing of multiple products, for example, according to market demands or customer requirement for multiple different products. For example, when a customer has a need for a product out of the multiple differing possible products, a request that is indicative of, for example, a product having all or alternatively only a subset of possible product features or capabilities, a request for the type of product needed is generated and sent to the semiconductor manufacturing facility. At the semiconductor manufacturing facility, a subset of upper level photomasks 820-830 corresponding to the product is selected in response to the request. The semiconductor manufacturing facility uses the lower level photomasks 810 and the selected subset of upper level photomasks to produce semiconductor wafers. The semiconductor wafers are further processed, such as passivated, tested, sawed, and the like to produce the products that meet the customer need In another example, the semiconductor manufacturing facility uses the subset of lower level photomasks 810 to produce semi-manufactured semiconductor wafers with lower level circuit structures, such as wells, active region, isolation, polysilicon gate, source, drain, contact, local interconnections in the lower metal layers, and the like. Further, in the example, the semiconductor manufacturing facility receives a request that is generated based on, for example, a customer need for a product. In an example, the request is indicative of compositions in the product. Based on the, request, a subset of upper level photomasks corresponding to the product is selected. The semiconductor manufacturing facility then uses the selected subset of upper level photomasks to further process one or more semi-manufactured semiconductor wafers to generate the upper level circuit structures, such as vias, interconnections in the upper metal layers, and the like on, the semiconductor wafers. The semiconductor wafers are further processed, such as passivated, tested, sawed, and the like to produce the products that meet the market demand.

According to an aspect of the disclosure, one or more photomasks in the subset of lower level photomasks 810, such as a polysilicon photomask, a contact hole photomask, and the like, include fine patterns that require relatively high resolution, and thus the one or more photomasks are produced with a relatively large cost. The interconnections are in the upper metal layers, and generally have relatively large dimensions, such as a relatively large width, compared to the polysilicon dimensions. The photomasks for the upper metal levels are generally produced with a relatively low cost. In the example, the, complete set of photomasks 800 is used to manufacture multiple IC products that share the lower level photomasks 810, but which are differentiated by the use of different upper level photomasks 820 that provide different interconnections of circuit components generated by the lower level photomasks 810.

Generally, a dominant factor of non-recurring engineering (NRE) one time cost is the cost of generating a set of photomasks. In an example, a set of photomasks in 14 nm technology costs about 5 million dollars. According to the disclosure, the set of photomasks 800 is used to manufacture multiple IC products, thus the cost of the photomasks 800 is justified by a total volume of the multiple IC products to improve return on investment (ROI).

According to an aspect of the disclosure, the multiple IC products are designed to share patterns for the lower level circuit structures, such as patterns of the polysilicon structures, patterns of contact hole structures, and the like. The multiple IC products are designed to be distinguishable by patterns in the upper level circuit structures, such as patterns of the upper metal layers.

Specifically, in the FIG. 8 example, the subset of lower level photomasks 810 and the first subset of upper level, photomasks 820 are used to produce products of component systems, and the subset of lower level photomasks 810 and the second subset of upper level photomasks 830 are used to produce product of a composite system. For example, the subset of lower level photomasks 810 defines lower level circuit structures for six modular circuit units (e.g., 811-816) of component systems. In an example, each modular unit is surrounded by a seal ring, and the subset of lower level photomasks 810 includes patterns 817 to form the seal rings that respectively surround the six modular circuit units. For example, the modular circuit units 811, 813 and 815 are units of a first component system (e.g., component system A in FIGS. 9-11), the modular circuit units 812, 814 and 816 are units of a second component system (e.g., component system B in FIGS. 9-11).

It is noted that a composite system AB that includes the component system A and the component system B share the same lower level circuit structures with a combination of the component system A and the component system B. Thus, in an example, the subset of lower level photomasks 810 also defines lower level circuit structures for three units of composite systems, such as, a first, composite unit that combines the modular circuit units 811 and 812, a second composite unit that combines the modular circuit units 813 and 814, and a third composite unit that combines the modular circuit unit 815 and 816.

Generally, a seal ring surrounds interior core circuitry of a circuit unit, for example, a seal ring is diposed between an edge of a die and the interior core circuitry in the die. The seal ring typically includes metal structures that are constructed simultaneously with the standard metal structures in the interior core circuitry to limit the intrusion of any cracks into the interior core circuitry for example, during a sawing process to separate dies on a semiconductor wafer. Also, the seal ring prevents moisture penetration or chemical damage lie acid, alkaline containing or diffusion of contaminating species into the interior core circuitry during circuit fabrication. In an example, the seal ring is formed in a back-end of a semiconductor process, such as with process to form metal lines. For example, a back-end of the semiconductor process includes steps to form five layers of metal lines and vias between the Metal lines, and the seal ring formed by the steps to form the metal lines and vias, and includes a stack of metal lines and vias in an example.

Further, in the example seen in FIG. 8, the first subset of upper level photomasks 820 includes patterns 828 (intra-unit patterns) that define upper level structures (e.g., intra-unit interconnections) respectively for six modular circuit units of component systems. In the FIG. 8 example, the first subset of upper level photomasks 820 includes patterns 827 that define inner seal rings in the upper level structures to respectively enclose the six modular circuit units, and patterns 826 that define outer seal rings in the upper level structures to enclose two modular circuit units in each outer seal ring. Thus, when the first subset of upper level photomasks 820 is used with the subset of, lower level Photomasks 810 in a semiconductor wafer process, fully encapsulated component system A and fully encapsulated component system B are produced.

The second subset of upper level photomasks 830 includes patterns 838 (intra-unit patterns) that define upper level structures intra-unit interconnections) respectively disposed entirely within respective ones of the six modular circuit units, and includes patterns 840 (inter-unit patterns) defining upper metal structures (e.g., inter-unit interconnections) that interconnect a modular circuit unit of component system A and a modular circuit unit of component system B to form a unit of the composite system AB. In the FIG. 8 example, the second subset of upper level photomasks 830 includes patterns 837 that define modified inner seal ring structures with openings 835 through which inter-unit patterns pass, and includes patterns 836 that define outer seal rings in the upper level structures to enclose two modular circuit units within each outer seal ring to form the composite system AB. It is noted that, solely for illustrative teaching purposes, the openings 835 seen in FIG. 1 are considerably lamer proportionally than would actually be manufactured. The seal ring structures in the upper level photomasks 830 are purposely formed with openings 835 in some circuit levels to facilitate routing of the inter-unit interconnections. Thus, when the second subset of upper level photomasks 830 is used with the subset of lower level photomasks 810 in a semiconductor wafer process, a composite system AB that includes component system A and component B is produced. For example, the second subset of upper level photomasks 830 defines upper level structures for composite units 831, 832 and 833.

In an example, the component system A has the same system-level functional specification of the component system B, and the component system A is implemented with the same RTL description, and same modular layout as the component system B. It is noted that, in an example, the, modular layout of the component system A has a different orientation from the modular layout of the component system B, for instance system A is a mirrored image of system B, in an embodiment.

In another example, the component system A has different system-level functional specification from the component system B, and the component system A is implemented with the different RTL description, and different modular layout from the component system B.

In an example, a manufacturing process includes ten metal connection layers and nine via layers, the upper level photomasks includes, for example, the seventh via layer and layers that are above the seventh via layer, and the lower level photomasks include layers that are below the seventh via layer.

FIG. 9 shows a diagram of a semiconductor wafer 900 according to an embodiment of the disclosure. In an example, the semiconductor wafer 900 is produced using the subset of the lower level photomasks 810 and the first subset of the upper level photomasks 820.

In the FIG. 9 example, the semiconductor wafer 900 is patterned by groups, such as a first group 901, a second, group 902, a third group 903, and the like. In an example, modular circuit units in a group are patterned together according to the photomasks. For example, during a photolithography process, a suitable photomask from the subset of the lower level photomasks 810 and the first subset of the upper level photomasks 820 is selected, and installed on a lithography projection system (e.g., a stepper, a scanner). The semiconductor wafer 900 is covered with photoresist. The lithography projection system, exposes the photoresist at a suitable location of the semiconductor wafer 900 according to the selected photomask to transfer patterns on the photomask to the photoresist at the suitable location as a group.

Then, in an example, the semiconductor wafer 900 is moved relative to the suitable photomask, and the lithography projection system exposes the photoresist on another location of the semiconductor wafer 900 according to the selected photomask to transfer the patterns on the photomask to the photoresist at the other location as another group.

In the FIG. 9 example, because the semiconductor wafer 900 is produced based on the subset of the lower level photomasks 810 and the first subset of the upper level photomasks 820, each group includes six, dies, such as dies 911-916 and the like. Each die is, surrounded by an inner seal ring 927, and the dies are separated by scribe lines 950 and 960. In the FIG. 9 example, each outer seal ring 926 surrounds two dies. In an example, the dies are sawed off the semiconductor wafer 900 along the scribe lines 950 and 960. It is noted that the outer seal rings 926 are cut during the dicing process step.

In the FIG. 9 example, each group, such as the second group 902, includes six modular circuit units of component systems. For example the dies 911, 913 and 915 are modular circuit units of component system A 970, and the dies 912, 914 and 916 are modular circuit units of component system B 980. In the FIG. 9 example, each modular circuit unit includes upper metal lines 928 (intra-unit interconnections) that are patterned according to the intra patterns 828 in the FIG. 8 example. Further, each modular circuit unit includes the complete (close) seal rings 927 (inner seal ring 927) that are patterned according to the patterns 817 in the subset of lower level photomasks 810 and the patterns 827 in the first subset of upper level photomasks 820.

In the FIG. 9 example, the semiconductor wafer 900 is sawed along the scrip. lines 950 and 960 to generate eighteen separate units of component systems.

Figure 10:
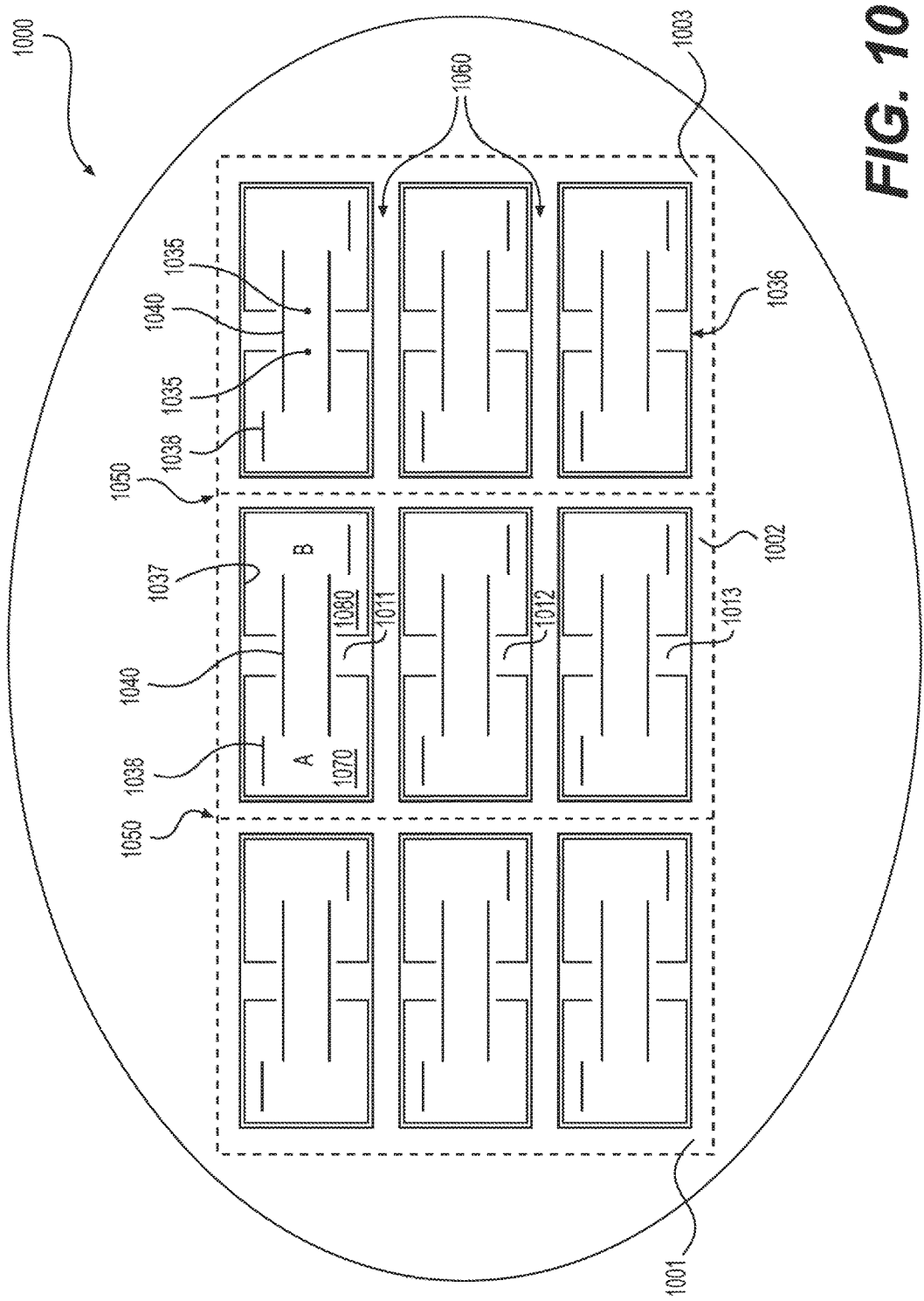
FIG. 10 shows a diagram of another semiconductor wafer 1000 manufactured using the photomasks 800 according to an embodiment of the disclosure.

FIG. 10 shows a diagram of another semiconductor wafer 1000 according to an embodiment of die disclosure. In an example, the semiconductor wafer 1000 is produced using the subset of the lower level photomasks 810 and the second subset of the upper level photomasks 830.

In the FIG. 10 example, the semiconductor wafer 1000 is patterned by groups, such as a first group 1001, a second group 1002, a third group 1003, and the like. In an example, units in a group are patterned together according to the photomasks. In an example, the semiconductor wafer 1000 is manufactured using the same process that is used to manufacture the semiconductor wafer 900, but the components formed on wafer 900 are patterned using the lower level photomasks 810 along with the second subset of upper level photomasks 830 instead of the first subset of upper level photomasks 820.

In the FIG. 10 example, because the semiconductor wafer 1000 is produced based on the subset of lower level photomasks 810 and the second subset of upper level photomasks 830, each group includes three units of composite system AB. For example, the group 1002 includes three units 1011, 1012 and 1013 of the composite system AB. Each unit of the composite system AB includes a component system A (e.g. 1070), and a component system B (e.g. 1080). In the FIG. 10 example, each component system includes upper metal lines 1038 (intra-unit interconnections) that are patterned according to the intra patterns 838 in the FIG. 8 example. In addition, the composite system AB includes interconnection metal lines 1040 (inter-unit interconnections) that are patterned according to the inter patterns 840 in the FIG. 8 example to interconnect the component system A and the component system B to form the composite system AB.

In the FIG. 10 example, the seal ring structure includes an inner seal ring 1037 with openings 1035 and an outer seal ring 1036 in the upper metal, layers. The inner seal ring 1037 is patterned according to the patterns 837 in the upper level photomasks 830. The outer seal ring 1036 is patterned according to the patterns 836. The inner seal rings 1037 have the openings 1035 that are purposely opened at selected locations to facilitate routing of the interconnection metal lines 1040.

In the FIG. 10 example, the dies are sawed off the semiconductor wafer 1000 along the scribe lines 1050 and 1060, thus each die includes a composite system AB.

Figure 11:
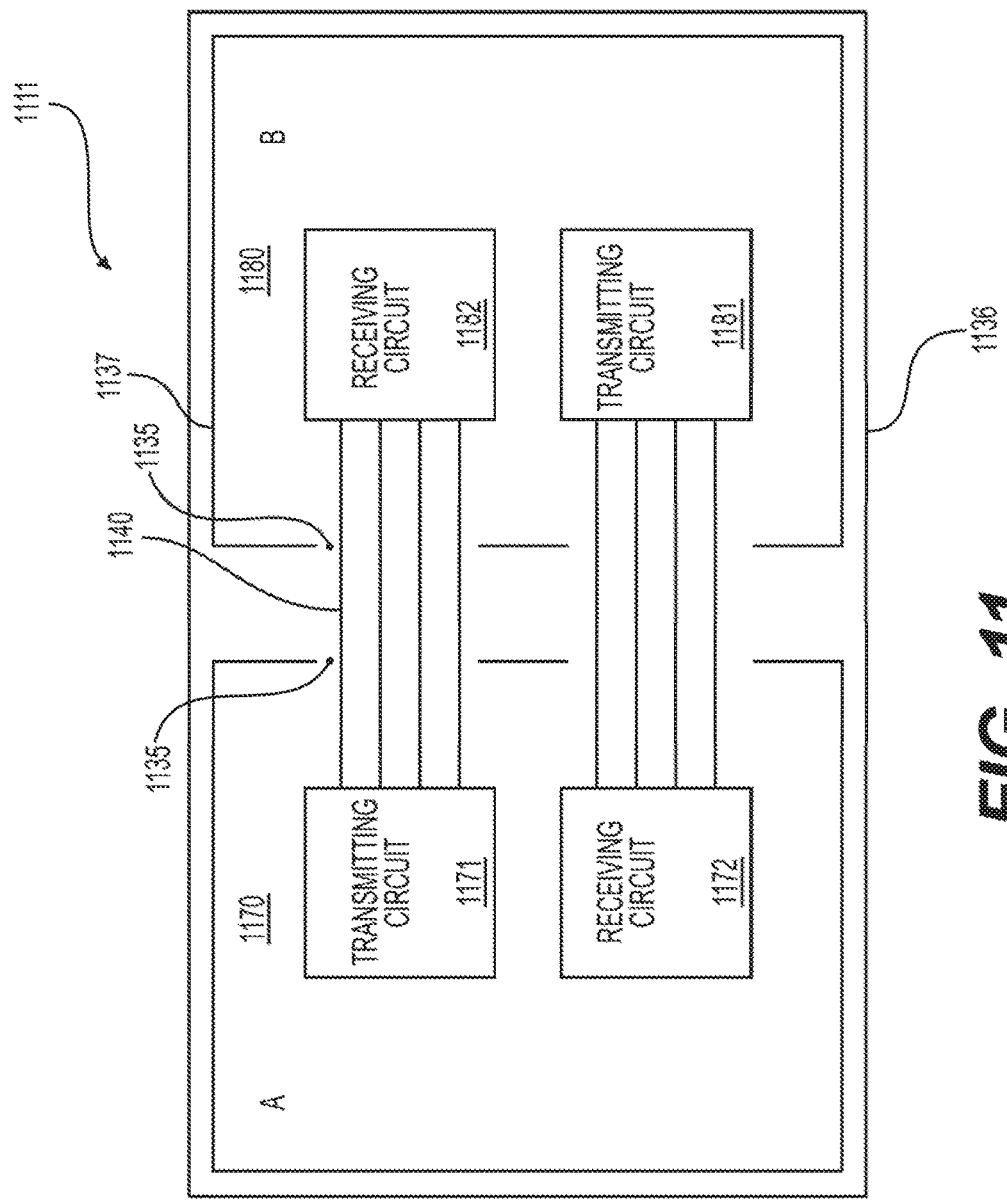
FIG. 11 shows a diagram of an integrated circuit (IC) manufactured using the photomasks 800 according to an embodiment of the disclosure.

FIG. 11 shows a block diagram of an integrated circuit (IC) die 1111 according to an embodiment of the disclosure. In an example, the die 1111 is sawed off from the semiconductor 1000.

The die 1111 is a composite system that includes a first component system 1170 and a second component system 1180. In, an example, the first component system 1170 is the same as the second component system 1180. It is noted that, in an example, corresponding structures in the first component system 1170 and the second component system 1180 have the same shape but different orientations. In another example, the first component system 1170 is different from the second component system 1180.

The first component system 1170 and the second component system 1180 respectively include interfaces to support signal transmissions between the two component systems. Specifically, in the FIG. 11 example, the first component system 1170 includes a first transmitting circuit 1171 and a first receiving circuit 1172, and the second component system 1180 includes a second transmitting circuit 1181 and a second receiving circuit 1182.

The die 1111 then includes interconnection metal lines 1140 that are formed, for example, according to the inter patterns 840 in the second subset of upper level photomasks 830, The interconnection metal lines 1140 enable the signal transmission between the two component systems so that they operate as an integral unit. For example, the first transmitting circuit 1171 is connected to the second receiving circuit 1182 via the interconnection metal lines 1140, thus the first transmitting circuit 1171 transmits signals via the interconnection metal lines 1140, and the second receiving circuit 1182 receives the signals from the interconnection metal fines 1140.

In the FIG. 11 example, the first component system 1170 and the second component system 1180 are circumscribed by a modified inner seal ring 1137 that includes openings 1135 in the upper metal layers. The combination of the first component system 1170 and the second component system 1180 is protected by an outer seal ring 1136. The modified inner seal rings 1137 have the openings 1135 that are purposely opened at selected locations to facilitate routing of the interconnection metal lines 1140. The inner seal ring 1137 is patterned according to, for example the patterns 837 in the second subset of the upper level photomasks 830, and are purposely formed with openings 1135 to facilitate routing of the interconnection metal lines 1140. The outer seal ring 1136 forms a complete seal ring to protect the composite system. It is noted that the seal rings include closed rings (not show) in the lower level layers that are patterned according to, for example, the patterns 817 in the lower level photomasks 810.

Figure 12:
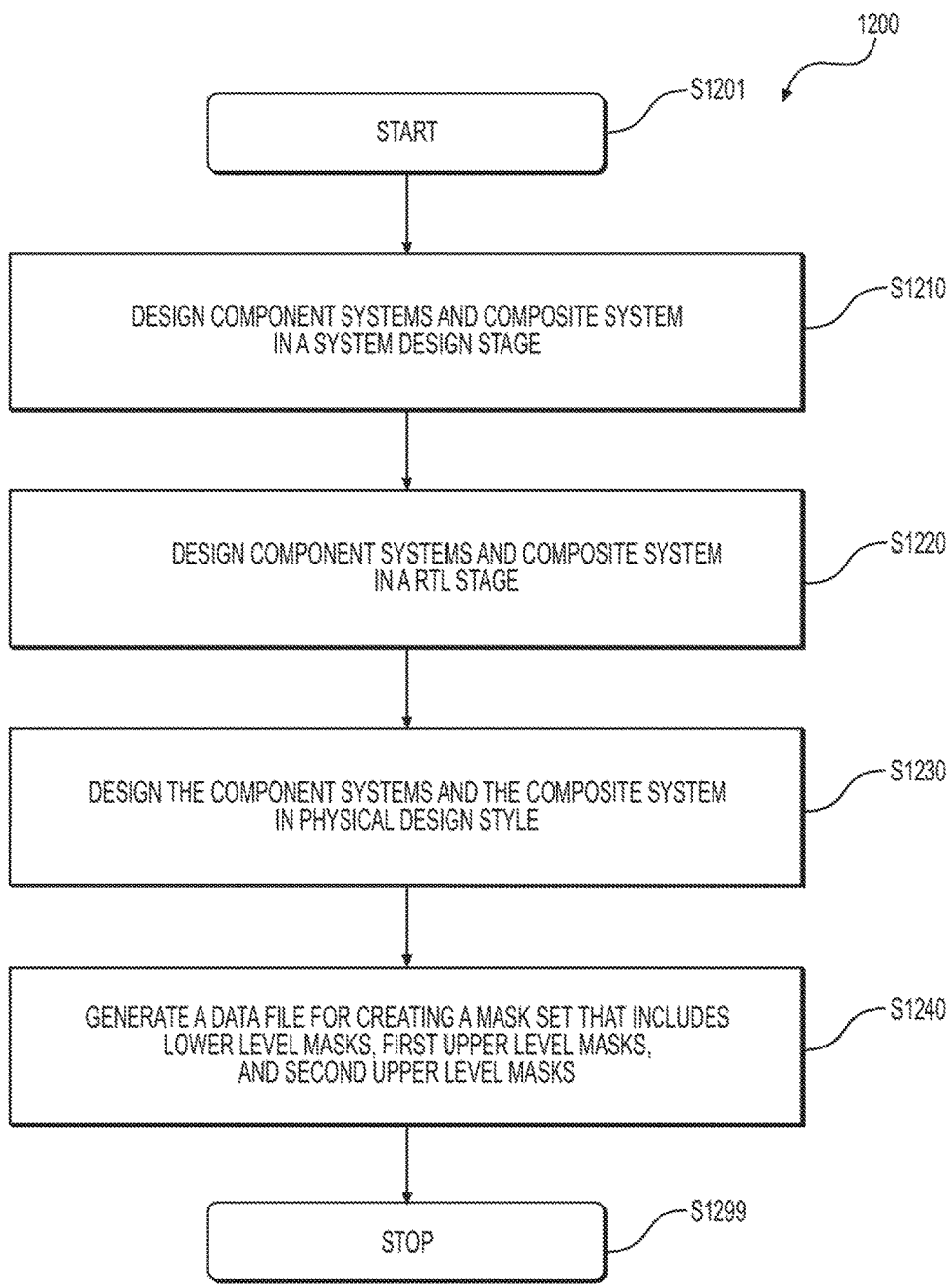
FIG. 12 shows a flow chart outlining a process 1200 for generating the photomask 800 according to an embodiment of the disclosure.
Figure 13:
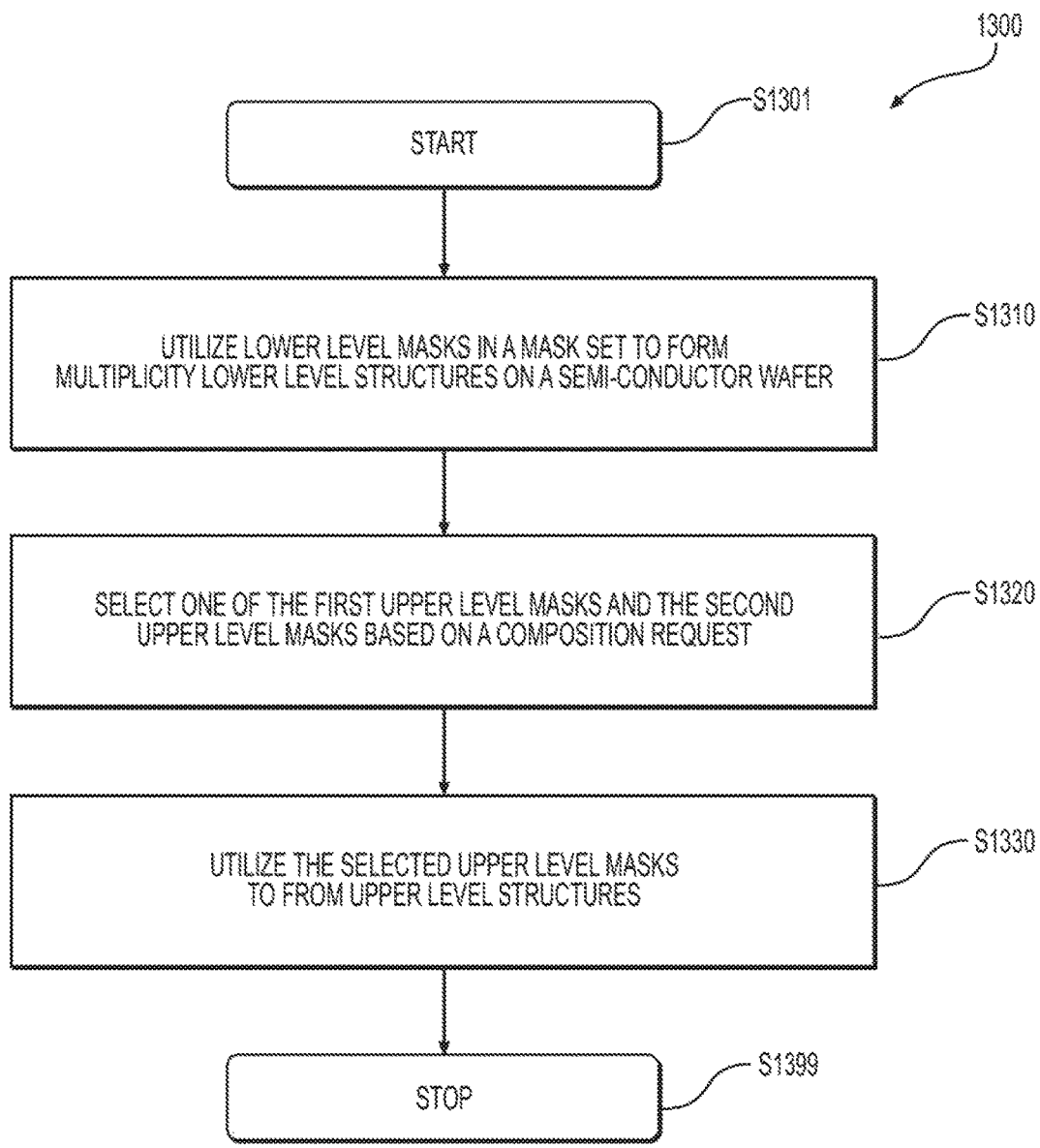
FIG. 13 shows a flow chart outlining a process 1300 for semiconductor wafer manufacturing according the photomasks 800 according to an embodiment of the disclosure.

FIG. 12 shows a flow chart outlining a process example 1200 according to an embodiment of the disclosure. In an example, the process 1200 is used to generate the set of photomasks 800. The process starts at S1201 and proceeds to S1210.

At S1210, at a system design stage, circuit designers design component systems and a composite system that combines two or more component systems. In an example, each of the component systems is an individually operable system that does not rely on the other component systems, and the two or more component systems are combined using communication channels to form a composite system. For example, a component system is a network switch system with a bandwidth of 5 terabits per second (Tbps) having N physical network ports for example. A composite system combines multiple network switch systems (e.g., two, four . . . ) to form a larger network switch system with a larger bandwidth (e.g., 10 Tbps, 20 Tbps . . . ) having M×N physical network ports for example. The circuit designers determine system-level functional specification and architectures of the composite system, and the component systems. In an example, the circuit designers design system-level functional specification and architectures of the component systems, and combine the component systems using communication channels to form the composite system. For example, the circuit, designers generate a communication channel between two component systems. In the example, each component system includes interfaces to the communication channel, and sends data signals or control signals to the other component system via the communication channel.

At S1220, at a register transfer level (RTL) stage, the circuit designers convert the system-level functional, specification of the component systems and the composite system into RTL description. In an embodiment, the circuit designers convert the system-level functional specification of the component systems into the RTL description. In an example, when the component systems are of the same system-level functional specification, the circuit designers convert the system-level functional specification of a component system into the RTL description. In another example, when the component systems are of different system-level functional specification, the circuit designers convert the system-level functional specification of the respective component systems into the RTL description.

Further, in an example, the circuit designers combine the RTL description of the component systems using signal transmission models to form the RTL description of the composite system.

At S1230, at a physical design stage, the circuit designers create layout for the respective component systems and for the composite system. In an embodiment, the circuit designers create layout for the component systems. The layout includes patterns in various layers, such as an active layer, a well layer, a polysilicon layer, a source/drain layer, contact layers, a plurality of metal layers, via Layers, and the like to form circuit structures in the component systems.

In an example, when the component systems are of the same RTL description, the circuit designers create a modular Layout for a component system, and suitably adjust the modular layout for other component systems. In another example, when the component systems are of different RTL description, the circuit designers create respective modular layouts for the component systems.

Further, the circuit designers suitably place the modular layouts together to form a layout including the component systems in the composite system. Then, the circuit designers create at least one replacement upper layers, such as a replacement upper metal layer, a replacement via layer, and the like to replace upper layers in order to combine the component systems into the composite system. The replacement upper layers include patterns to form the inter-unit interconnections that connect the component systems.

In an embodiment, the circuit designers determine constraints for creating the modular layouts of the component systems in order to facilitate combining the component systems. In an example, the circuit designers limit a dimension of the modular layouts for the component stein to be about the same. In another example, the circuit designers specify a specific area in a modular layout for circuits interfacing with the interconnections.

It is noted that in some embodiments the circuit designers add other suitable patterns, such as dummy patterns, parametric test structures, alignment marks, and the like in the layout for, other purposes, such as design for manufacturing purpose, testing purpose, alignment purpose, and the like.

At S1240, a data file corresponding, to the layout is generated. The data file is used to generate a set of photomasks, such as the set of photomasks 800, that include a subset of lower level photomasks the subset of lower level photomasks 810) and multiple subsets of upper level photomasks (e.g., the first subset of upper level photomasks 820, the second subset of upper level photomasks 830). The set of photomasks 800 is then used in a semiconductor wafer manufacturing facility to manufacture semiconductor devices. The process proceeds to S1299 and terminates.

FIG. B shows a flow chart outlining a process 1300 according to an embodiment of the disclosure. In an example, the process 1300 is used ire a semiconductor wafer manufacturing facility to produce ICs on semiconductor wafers using the set of photomasks 100. The process starts at S1301 and proceeds to S1310.

At S1310, the subset of lower level photomasks 810 is used to produce multiple modular lower level structures on one or more semiconductor wafers. In an example, the semiconductor manufacturing facility uses the subset of lower level photomasks 810 to produce semi-manufactured semiconductor wafers with lower level circuit structures, such as wells, active region, isolation, polysilicon gate, source, drain, contact, local interconnections in the lower metal layers, and the like.

At S1320, a subset of upper level photomasks is selected in response to a composition request. In an example, the semiconductor manufacturing facility receives a request that is generated based on, for example, market demand for a product or requests from specific customers. In an example, the request is indicative of a desired capacity or features of the product, such as a quantity of ports, capabilities or bandwidth in a network device. Based on the request, a subset of upper level photomasks corresponding to the product is selected. In an example, when the request is for component system A or component system B, the first subset of upper level photomasks 820 is selected. When the request is for the composite system AB, the second subset of upper level photomasks 830 is selected.

At S1330 the selected upper level photomasks are used to produce upper level structures on the semi-manufactured semiconductor wafers. In an example, the semiconductor manufacturing facility then uses the selected subset of upper level photomasks further process one or more partially manufactured semiconductor wafers to generate the upper level circuit structures, such as vias, interconnections in the upper metal layers, and the like on the semiconductor wafers. Then, the process proceeds to S1399 and terminates.

It is noted that, in an example, the semiconductor wafers are further processed, such as passivated, tested, sawed, and the like to produce dies of the product that meet the market demand.

It is also noted that, in an example, the process 1300 is suitably adjusted. For example, the request is first received, and a subset of upper level photomasks is selected in response to the request. Then, the semiconductor manufacturing facility uses the subset of the lower level photomasks 810 and the selected subset of upper, level photomasks to produce one or more semiconductor wafers.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) formed on a die, comprising:
   first one or more electronic circuits disposed on a first semiconductor substrate, the first semiconductor substrate being diced from a semiconductor wafer; and
   a seal ring structure surrounding the first one or more electronic circuits, the seal ring structure being formed by patterning one or more layers of metal compounds on the semiconductor wafer using two or more circuit formation process steps, and being a remaining portion of a complete seal ring structure after a dicing process step that cuts the complete seal ring structure, the complete seal ring structure having been formed on the semiconductor wafer to surround the first one or more electronic circuits and second one or more electronic circuits disposed on a second semiconductor substrate that is diced from the semiconductor wafer, the seal ring structure including (i) a first inner seal ring surrounding the first one or more electronic circuits and (ii) a second inner seal ring surrounding the second one or more electronic circuits, a first opening in the first inner seal ring and a second opening in the second inner seal ring being defined by a photomask, which includes patterns that define interconnections for crossing a scribe line area and interconnecting the first one or more electronic circuits with the second one or more electronic circuits, wherein the photomask omits dummy patterns in the scribe line area.

2. The IC of claim 1, wherein the seal ring structure comprises:
a partial outer seal ring surrounding the first inner seal ring, the partial outer seal ring being a remaining portion of a complete outer seal ring after a dicing process step that cuts the complete outer seal ring, the complete outer seal ring having been formed on the semiconductor wafer to surround the first inner seal ring and at least the second inner seal ring that is formed to surround the second one or more electronic circuits on the second semiconductor substrate that is diced from the semiconductor wafer.

3. The IC of claim 2, wherein the complete outer seal ring is configured to completely surround the first inner seal ring and the second inner seal ring that are adjacent with a scribe line in between, and wherein the semiconductor wafer is diced along the scribe line to leave the partial outer seal ring on the first semiconductor substrate, and another partial outer seal ring on the second semiconductor substrate.

4. The IC of claim 2, wherein the partial outer seal ring is configured to partially surround the first inner seal ring with an opening after the dicing process step.

5. The IC of claim 2, wherein the partial outer seal ring is configured to completely surround the first inner seal ring after the dicing process step.

6. The IC of claim 2, wherein the semiconductor wafer is patterned according to a set of photomasks with at least the photomask for substituting a photomask in the set of photomasks.

7. The IC of claim 1, wherein the seal ring structure is formed by patterning at least one of a first metal layer of a first metal compound for forming a metal line connection between circuit elements disposed in the first metal layer of the integrated circuit.

8. The IC of claim 7, wherein the seal ring structure is formed by patterning at least one of a second metal layer of a second metal compound for forming a via connection between circuit elements disposed in different layers of the integrated circuit.

9. An integrated circuit (IC) formed on a die, comprising:
first one or more electronic circuits disposed on a semiconductor substrate that is diced from a semiconductor wafer;
a first inner ring-like structure surrounding the first one or more electronic circuits;
second one or more electronic circuits disposed on the semiconductor substrate;
a second inner ring-like structure surrounding the second one or more electronic circuits, the second inner ring-like structure being spaced from the first inner ring-like structure by a scribe line area;
interconnections configured to cross the scribe line area to interconnect the first one or more electronic circuits with the second one or more electronic circuits; and
an outer seal ring surrounding the first inner ring-like structure and the inner ring-like structure, the first inner ring-like structure and the second inner ring-like structure (i) being formed by patterning one or more metal layers on the semiconductor wafer and (ii) having openings in a subset of the one or more metal layers to allow the interconnections to interconnect the first one or more electronic circuits with the second one or more electronic circuits, wherein the subset of the one or more metal layers omits dummy patterns in the scribe line area.

10. The IC of claim 9, wherein the outer seal ring is formed by patterning the one or more metal layers on the semiconductor wafer using two or more circuit formation process steps.

11. The IC of claim 10, wherein the first inner ring-like structure and the second inner ring-like structure are configured to completely surround the first one or more electronic circuits and the second one or more electronic circuits respectively in a second subset of the one or more metal layers.

12. The IC of claim 10, wherein the first inner ring-like structure, the second inner ring-like structure and the outer seal ring are formed by patterning at least one of a first metal layer of a first metal compound for forming a metal line connection between circuit elements disposed in the first metal layer of the integrated circuit.

13. The IC of claim 12, wherein the first inner ring-like structure, the second inner ring-like structure and the outer seal ring are formed by patterning at least one of a second metal layer of a second metal compound for forming a via connection between circuit elements disposed in different layers of the integrated circuit.

14. The IC of claim 10, wherein the semiconductor wafer is patterned according to a set of photomasks with at least one substitute photomask for substituting a specific photomask in the set of photomasks, the specific photomask defining the first inner ring-like structure and the second inner ring-like structure in a specific layer with openings, and the substitute photomask defining the first inner ring-like structure and the second inner ring-like structure in the specific layer without openings.

15. The IC of claim 9, wherein
the first one or more electronic circuits comprise a transmitting circuit;
the second one or more electronic circuits comprise a receiving circuit; and
the interconnections are configured to interconnect the transmitting circuit with the receiving circuit over circuit traces formed in upper metal layers of the integrated circuit, the circuit traces configured to pass through openings in the ring-like structures.

16. A method of forming integrated circuit (IC) on a die, comprising:
disposing first one or more electronic circuits on a semiconductor wafer;
disposing second one or more electronic circuits on the semiconductor wafer;
disposing a first inner seal ring surrounding the first one or more electronic circuits, a second inner seal ring surrounding the second one or more electronic circuits, and an outer seal ring surrounding the first inner seal ring and the second inner seal ring, the second inner seal ring being spaced from the first inner seal ring by a scribe line area;

defining, by a photomask, a first opening in the first inner seal ring and a second opening in the second inner seal ring, the photomask including patterns that define interconnections for crossing the scribe line area and interconnecting the first one or more electronic circuits and the second one or more electronic circuits;

omitting, by the photomask, dummy patterns in the scribe line area; and dicing from the scribe line area to cut the outer seal ring and separate the semiconductor wafer into at least a first die with the first one or more electronic circuits, the first inner seal ring and a first partial outer seal ring on the first die, and a second die with the second one or more electronic circuits, the second inner seal ring, and a second partial outer seal ring on the second die.

* * * * *